US010876210B1

(12) United States Patent
Claussen et al.

(10) Patent No.: US 10,876,210 B1
(45) Date of Patent: Dec. 29, 2020

(54) TUNABLE NANO-STRUCTURED INKJET PRINTED GRAPHENE VIA UV PULSED-LASER IRRADIATION FOR ELECTROCHEMICAL SENSING

(71) Applicant: Iowa State University Research Foundation, Inc., Ames, IA (US)

(72) Inventors: Jonathan Claussen, Ames, IA (US); Suprem Das, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 0 days.

(21) Appl. No.: 15/588,330

(22) Filed: May 5, 2017

Related U.S. Application Data

(60) Provisional application No. 62/332,288, filed on May 5, 2016.

(51) Int. Cl.
  *B05D 3/06* (2006.01)
  *C23C 16/56* (2006.01)
  *B41J 2/01* (2006.01)
  *C23C 18/14* (2006.01)

(52) U.S. Cl.
  CPC .............. *C23C 16/56* (2013.01); *B41J 2/01* (2013.01); *C23C 18/14* (2013.01)

(58) Field of Classification Search
  CPC .................................................. C23C 18/14
  USPC ........ 427/554, 555, 557, 558, 559, 121, 122
  See application file for complete search history.

(56) References Cited

U.S. PATENT DOCUMENTS

| 8,404,070 | B2 * | 3/2013 | Zhang | H01J 37/20 |
| | | | | 156/267 |
| 8,664,699 | B2 | 3/2014 | Nuzzo et al. | |
| 8,810,996 | B2 | 8/2014 | Lee et al. | |
| 9,099,376 | B1 * | 8/2015 | Yung | H01L 29/1606 |
| 9,865,380 | B2 * | 1/2018 | Logakis | B32B 9/007 |
| 10,632,534 | B2 * | 4/2020 | Cheng | H01L 31/1884 |
| 10,648,958 | B2 * | 5/2020 | Strong | B32B 3/28 |
| 10,683,586 | B2 * | 6/2020 | Ozyilmaz | C01B 32/186 |

(Continued)

OTHER PUBLICATIONS

D.J. Finn et al.; "inkjet deposition of liquid-exfoliated graphene and MoS2 nanosheets for printed device applications"; Journal of material chemistry C; Royal Society of chemistry; Dec. 9, 2013; pp. 925-932.*

(Continued)

*Primary Examiner* — Marianne L Padgett
(74) *Attorney, Agent, or Firm* — McKee, Voorhees & Sease, PLC

(57) ABSTRACT

An apparatus, method, and system for post-processing a printed graphene ink pattern or other deposition on a substrate. A pulsed UV laser is tunable between various energy densities to selectively modify the printed ink or deposition in electrical or physical properties. In one example, radical improvements in electrical conductivity are achieved. In another example, controlled transformation from essentially 2D printed or deposited graphene to surface topology of 3D nanostructures are achieved. The 3D structures are beneficial in such applications as electrochemical sensors of different types and characteristics. In another example, hydrophobicity of the printed or deposited graphene can be manipulated starting from a hydrophilic to super hydrophobic surface.

19 Claims, 24 Drawing Sheets

(56) References Cited

U.S. PATENT DOCUMENTS

| | | | | |
|---|---|---|---|---|
| 2010/0266964 | A1* | 10/2010 | Gilje | B82Y 30/00 430/322 |
| 2011/0020563 | A1* | 1/2011 | Jiang | H01J 37/20 427/554 |
| 2011/0318257 | A1* | 12/2011 | Sokolov | B82Y 30/00 423/448 |
| 2012/0003438 | A1 | 1/2012 | Appleton et al. | |
| 2013/0171452 | A1* | 7/2013 | Goela | H01B 1/06 428/408 |
| 2014/0103298 | A1 | 4/2014 | Lee et al. | |
| 2014/0315012 | A1* | 10/2014 | Iroh | C08K 3/04 428/323 |
| 2015/0147701 | A1* | 5/2015 | Kim | G03F 7/2004 430/325 |
| 2015/0360477 | A1* | 12/2015 | Khe | B41J 11/002 347/47 |
| 2016/0077074 | A1* | 3/2016 | Strong | B32B 9/007 428/184 |
| 2016/0148759 | A1* | 5/2016 | El-Kady | H01G 11/36 428/178 |
| 2016/0250712 | A1* | 9/2016 | Cheng | B22F 1/0025 219/58 |
| 2018/0215621 | A1* | 8/2018 | Desmet | C01B 32/192 |
| 2019/0022974 | A1* | 1/2019 | Lin | B32B 9/007 |
| 2020/0064292 | A1* | 2/2020 | Chang | G01N 27/127 |

OTHER PUBLICATIONS

R.S. Singh et al.; "Laser Patterning of Epitaxial Graphene for Schottky Junction Photodetectors"; ACS Nano; vol. 5, No. 7; Jun. 24, 2011 ; pp. 5969-5975.*

E. Jabari et al.; "Laser heat treatment of aerosol jet additive manufactured graphene patterns"; Journal of Physics D: Applied Physics; vol. 48; Aug. 21, 2015; pp. 375503(8pp).*

E.B. Secor et al.; "Rapid and Versatile Photonic Annealing of Graphene Inks for Flexible Printed Electronics"; Advanced Materials: Materials Views; Sep. 30, 2015; pp. 6683-6688.*

S.K. Del et al.; "Optimizing the optical and electrical properties of graphene ink thin films by laser annealing"; 2D Materials: Letter; Feb. 20, 2015; 6 pages + cover sheet.*

R.Trusovas et al.; "Recent Advances in Lasers Utilization in the Chemical Modification of Graphene Oxide and its Applications"; Advance Optical Materials; Review; Materials Views; vol. 4, pp. 37-65; published Oct. 26, 2015.*

"YAG lasers" from RP Photonics Encyclopedia; cover page +7 pages, retrieved from www.rp-photonics.com/yag_lasers.HTML on Jun. 4, 2020 (no date, no author given).*

Das et al., "3D Nanostructured Inkjet Printed Graphene via UV-Pulsed Laser Irradiation Enables Paper-based Electronics and Electrochemical Devices", Nanoscale. 2016, 8, (35), 15870-15879 Sep. 21, 2016.

Torrisi et al., "Inkjet-Printed Graphene Electronics", ACS Nano, 2012, 6 (4), pp. 2992-3006. Mar. 9, 2012.

Chen et al., "Fabrication of Graphene by Pulsed Laser Annealing From a Graphene Oxide Thin Film", Conference on Lasers and Electro-Optics 2012, OSA Technical Digest (online) (Optical Society of America, 2012), paper JW4A 121, May 6-11, 2012; 3 pages.

Claussen et al., "Nanostructuring Platinum Nanoparticles on Multilayered Graphene Petal Nanosheets for Electrochemical Biosensing", Adv. Fund. Mater. 2012, 22, 3399-3405. [App G to provl] May 9, 2012.

Secor et al., "Inkjet Printing of High Conductivity, Flexible Graphene Patterns", J. Phys. Chem. Lett., 2013, 4 (8), pp. 1347-1351. Apr. 8, 2013.

Dume, Bella, "Laser Anneal Improves Graphene Ink", http://nanotechweb.org/cws/article/tech/60388 (3 pages). Mar. 2, 2015.

Li et al., "Efficient Inkjet Printing of Graphene", Adv. Mater., 2013, 25 (29), pp. 3885-3992. May 31, 2013.

Arapov, et al., "Inkjet Printing of Graphene", Faraday Discuss., 2014, 173, pp. 323-336. May 20, 2014.

Parc, A Xerox Company. Printed and Flexible Electronics. www.parc.con/services/focus-area/flexible-and-LAE/ (from internet 2015) (4 pages) 2015, Aug. 25, 2015.

* cited by examiner

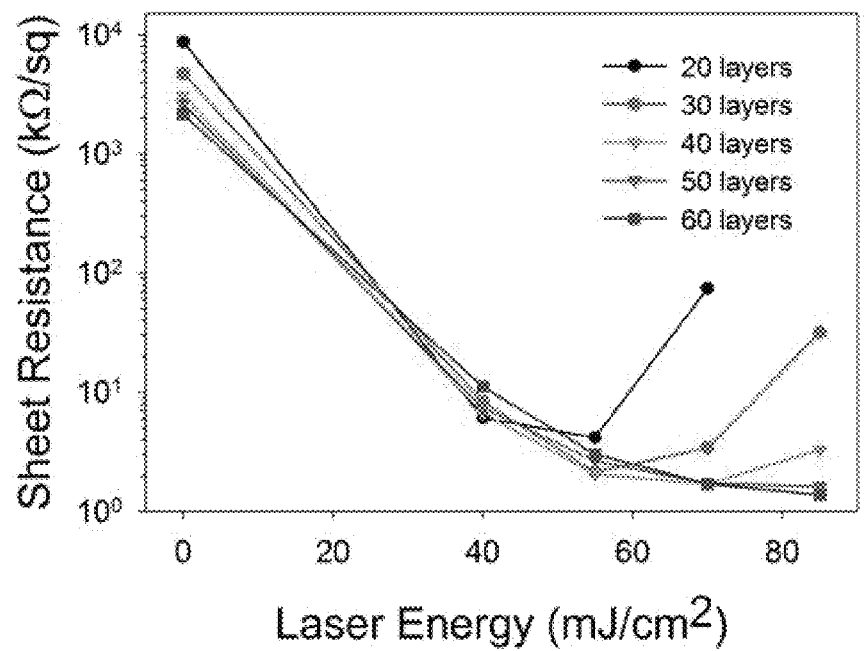
FIG. 1D
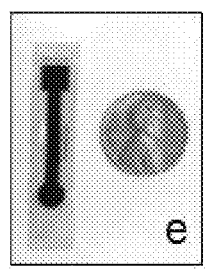 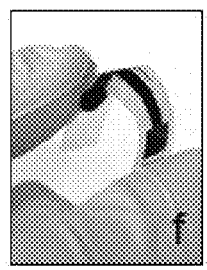 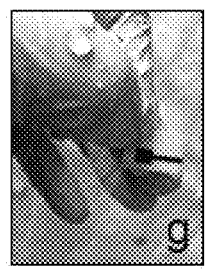 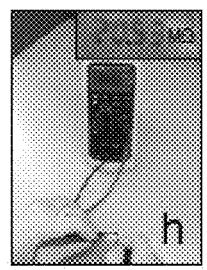
FIG. 1E    FIG. 1F    FIG. 1G    FIG. 1H

TUNABLE NANO-STRUCTURED INKJET PRINTED GRAPHENE VIA UV PULSED-LASER IRRADIATION FOR ELECTROCHEMICAL SENSING

CROSS-REFERENCE TO RELATED APPLICATIONS

This application claims the benefit of Provisional Application U.S. Ser. No. 62/332,288 filed on May 5, 2016, all of which is herein incorporated by reference in its entirety.

BACKGROUND OF THE INVENTION

A. Field of the Invention

The present invention relates to any single layer or multilayer graphene deposited on a surface including but not limited to by inkjet printing, screen printing, gravure printing, dip coating, spray coating, spin coating, with subsequent laser irradiation including but not limited to via a UV pulsed laser, in particular, to create a tunable two dimensional (2D) smooth surface to three dimensional (3D) nanostructured form for a variety of applications including but not limited to electrical circuits, electrochemical sensors/biosensors, and super hydrophobic surface coatings.

B. Problems in the Art

Much work is being conducted in this field. Inkjet printing containing graphene allows relatively economical and repeatable design and production of a variety of printed patterns or layers on a substrate or surface. Ink jet printing is a relatively mature technology. By mixing with organic solvents, ink containing single layer graphene particles (sometimes called flakes) can be applied to a substrate in pre-determined patterns. The pattern is software-controlled. The pattern is software designed and computer controlled.

Inkjet printing of graphene or graphene oxide infused ink is known in the art, including for creating articles of manufacture that are electrically functional. See, for example, Torrisi, et al., Inkjet-Printed Graphene Electronics, ACS Nano, 2012, 6, 2992-3006, and Lee et al, U.S. Pat. No. 8,810,996 both incorporated by reference herein in their entireties.

Graphene is basically free-standing two-dimensional (2D) pieces or sheets of graphite. Its properties have been applied in, e.g., the semiconductor electronics, rechargeable lithium ion battery energy and composite industries. An example of graphene in sheet form and multiple layers used with electrodes for sensors is disclosed in Claussen, et al., Nanostructuring Platinum Nanoparticles on Multilayered Graphene Petal Nanosheets for Electrochemical Biosensing, Adv. Funct. Mater. 2012, 22, 3399-3405, which is incorporated by reference herein.

While the form factor of graphene flakes can be small enough (e.g. nano-scale) to allow mixing in formulations that can be ink jet printed, it has been discovered that the resulting printed material tends to be resistive more than conductive. A variety of post-printing processes have been reported to increase electrical conductivity and/or device performance. Some are chemical. Some are thermal.

Post-printing thermal annealing is believed to reduce the electrically resistive graphene circuit to purer graphene or otherwise improve its electrical conductivity. However, conventional post-print thermal annealing tends to heat the whole printed pattern and its substrate. Common techniques are ovens or heat sources such as lamps. This prevents printing on some substrates. For example, flexible substrates (e.g. polymers, paper, or otherwise) might be damaged or degraded by the heating, which tends to be in the range of 170°-450° C. Still further, other components on the substrate (e.g. other electrical or functional components in addition to the printing and the substrate), could be adversely affected by such temperatures.

Chemical post-printing processing can have similar problems as post-printing thermal annealing.

Furthermore, post-print annealing has focused on improved conductivity through either removing nonconductive ink binders and/or reducing graphene oxide to graphene. Graphene oxide is obtained by treating graphite with strong oxidizers. One benefit is that a sheet of molecular layers or flakes can be produced. However, graphene oxide does not have the extraordinary electrical properties of graphene.

Thus, there is opportunity for innovation in this technical field or art.

SUMMARY OF THE INVENTION

A. Objects of the Invention

A principle object, feature, aspect, or advantage of the present invention is to improve over or solve problems or deficiencies in the state of the art.

Other objects, features, aspects, or advantages of the present invention relate to controlled deposition of graphene with UV pulsed laser annealing which:
a. introduces a new paradigm from conventional thermal or chemical post-printing processing;
b. can be applied to a wide variety of substrates, including at least some flexible substrates;
c. can be implemented with respect to single layer printed graphene or plural layers, as well as to virtually any printed or controlled image, whether repeated or non-repeating discrete patterns on a substrate, connected or partially connected circuits on a substrate, or continuous surface coating of a substrate;
d. can improve the electrical properties of the pattern, including improvements of several orders of magnitude and selected levels of conductivity;
e. can avoid annealing or chemical damage to other materials or components at and around the pattern or layer by being spatially selective;
f. can be tuned or adjusted to produce different end-result physical and electrical properties for the pattern or layer;
g. can be utilized to produce 2D smooth film to 3D nano-structures in the pattern or layer, at least some of which can be used advantageously for such things as electrochemical and bio sensing, including control of nature of the 3D structures depending on desired use or function;
h. promotes a robust adhesion to the substrate and resistance to degradation of the pattern by environmental conditions over time or forces applied to it such as washing or rubbing;
i. has a wide range of tunability of properties of the graphene coated surface—e.g., in one example, the graphene can be tuned from a hydrophilic surface to one that is superhydrophobic by changing the power density of the laser.

B. Aspects of the Invention

In one aspect of the invention, the new paradigm of post-printing processing of patterned or otherwise generated graphene controls laser energy density spatially relative to the pattern, or any portion thereof, in a selective manner to enrich or enhance any such portions. One example of controlled or tunable laser energy density is moving the laser's beam across the selected portion or portions of the pattern while pulsing the laser. This selective control of intensity versus time at the pattern allows relatively high energy but at short duration and at just the desired pattern areas. This deters damage or overlap to undesired areas of either the pattern, substrate, or other components at or on the substrate. This technique can be controlled to sufficiently anneal the pattern or layer portions, but unlike conventional post-printing annealing, can focus enormous power density, non-destructively of the pattern/layer or substrate plus induce radical surface and/or electrical modifications to the graphene flakes at selected portions of the pattern/layer. This spatially controlled, tunable laser energy density can be implemented in a variety of apparatus, methods, and systems, and relative to a range of functionalities. One example is to anneal at different power levels to change or tune the electrical conductivity or hydrophobicity.

In one aspect of the invention, a method of deposition of the pattern comprises ink jet printing of a graphene ink pattern onto a substrate. A pulsed laser irradiates at least a portion of the printed pattern. Operating parameters of the pulsed laser are controlled or tuned to produce desired physical or electrical properties in the irradiated portions of the pattern.

One example of tuning is control of laser power density at a portion of the pattern to produce improved conductivity. The laser power density can be tuned to produce different structure and electrical conductivities. Therefore, through empirical studies and/or calibration, a range of conductivities can be produced by tuning the laser to a correlated power density. It has been shown that conductivities of several orders of magnitude better than conventional thermal or chemical post-printing processing can achieve. But irrespective of magnitude of conductivity improvement, use of controlled pulsed laser energy can alter electrical properties of the portion of the pattern non-destructively of substrates, other portions of the pattern, or other components on the substrate that otherwise might be destroyed, degraded, or adversely affected by conventional thermal or chemical post-printing processing. Pulsed laser irradiation can range from one or more discrete portions of the pattern to the whole pattern by control of laser spot size and placement relative to the pattern.

Another example of tuning is control of laser power density at a portion of the pattern to produce morphological changes in the pattern. Different power densities can produce different morphologies. It has been shown that morphological changes of varying types and degrees occur over a range of laser power densities. Therefore, through empirical studies and/or calibration, a range of pulsed laser-induced physical changes in an irradiated portion of the pattern can be produced by tuning the laser to a correlated power density. In one example, certain power densities are indicated to smooth and weld/stitch/join graphene flakes in the printed pattern, which promotes higher conductivity. In another example, certain power densities are indicated to promote transformation of the graphene flakes from essentially 2D morphology to 3D morphology with even higher values of electrical conductivity. This can include wrinkling and rotation, which produces out-of-plane nanostructures. One form factor are petal-like structures. Testing has shown such structures to be beneficial for such things as electrochemical sensing. A few non-limiting examples of sensing are hydrogen peroxide, dopamine, ascorbic acid and other electroactive species, but also biomarkers such as glucose, xanthine, and lactate via the immobilization of an enzyme onto the graphene or cytokines, proteins, DNA with the immobilization of an antibody, aptamer, or peptide onto the graphene surface. Hence, the small scale of these structures can be advantageous for a wide variety of sensing applications. Thus, power density of the pulsed laser can be selectively set to promote one of a range of morphologies according to a desired functional application of the pattern. Again, modification by controlled irradiation with the pulsed laser can range from one discrete portion of a printed pattern to the whole pattern. More information about petal-like 3D structuring produced by a different technique can be found at Claussen, et al., Nanostructuring Platinum Nanoparticles on Multilayered Graphene Petal Nanosheets for Electrochemical Biosensing, Adv. Funct. Mater. 2012, 22, 3399-3405, incorporated by reference herein in its entirety.

Another example of tuning is control of laser power density at a portion of the printed pattern to control or determine hydrophobicity of a surface. An inkjet printed or otherwise created pattern or layer(s) of graphene ink on the surface can be irradiated by the pulsed laser at a predetermined power density. Through empirical studies and/or calibration, a range of pulsed laser-induced physical changes in an irradiated portion of the pattern can be produced by tuning the laser to a correlated power density. These changes have been shown to produce varying levels of hydrophobicity for the layer, and thus for the surface the layer covers. These range from just above hydrophilic to super hydrophobic. Examples of techniques for creation of graphene-based films on surfaces can be found at Lee et al., U.S. Published Patent Application 2014/0103298 and Appleton et al., U.S. Published Patent Applications 2012/0003438, both incorporated by reference herein in their entireties.

In one aspect of the invention, the laser is a UV laser having controllable duty cycle and optical components to focus and control the laser beam relative to the pattern. In one example, such a system includes a pre-determined ink formulation including graphene flakes, an inkjet printer, a UV laser, and beam shaper, a lens, and an actuator to move laser or substrate to be printed relative one another to a high degree of resolution (micro or nano scale precise and accurate movements). Type, power levels, and driving control of the laser is selected for pulsed laser irradiation effective to produce a desired change in the inkjet printed graphene pattern or layer (or layers).

In another aspect of the invention, an article of manufacture includes an inkjet printed graphene pattern which has had at least a portion of it irradiated with a pulsed UV laser at a power density tuned to a desired change in electrical or physical properties of the irradiated portion of the inkjet printed pattern or layer(s). Non-limiting examples of the article of manufacture can embody an electrical circuit and substrate, an electrochemical sensor, or a coating or layer over a surface and making a super hydrophobic graphene surface.

These and other objects, features, aspects, or advantages of the invention will become apparent with reference to the accompanying specification.

BRIEF DESCRIPTION OF DRAWINGS

The patent or application file contains at least one drawing executed in color. Copies of this patent or patent application publication with color drawing(s) will be provided by the Office upon request and payment of the necessary fee.

FIG. 1D is a graph showing improvements in conductivity for patterns of different thicknesses (e.g. ~500 nm to 3.5 μm).

FIGS. 1E-H are photos of one exemplary embodiment of a pattern in the form of an electrode printed on a flexible substrate on cellulose based printing paper respectively.

FIG. 9 is not used.

DETAILED DESCRIPTION OF EXEMPLARY EMBODIMENTS OF THE INVENTION

A. Overview

For a better understanding of the invention, one or more specific forms or embodiments the invention can take will now be described in detail. It is to be understood, however, that any such examples are by way of illustration and are neither exclusive nor inclusive of all the forms and embodiments the invention can take.

In this description, reference will sometimes be taken to the accompanying drawings itemized above.

B. General Apparatus and System

Figure 1A:
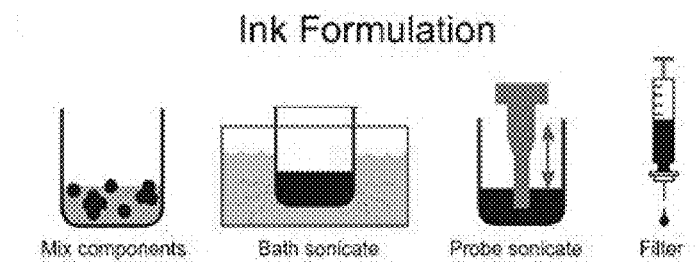
FIGS. 1A-C are diagrams showing one ink jet ink formulation and printing system for laser annealing of a printed graphene pattern according to one exemplary embodiment of the present invention.
Figure 1B:
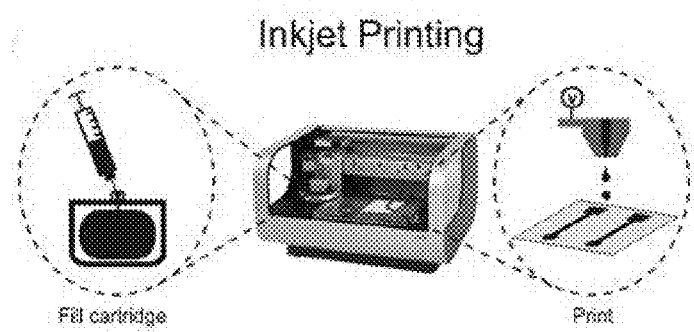
Figure 1C:
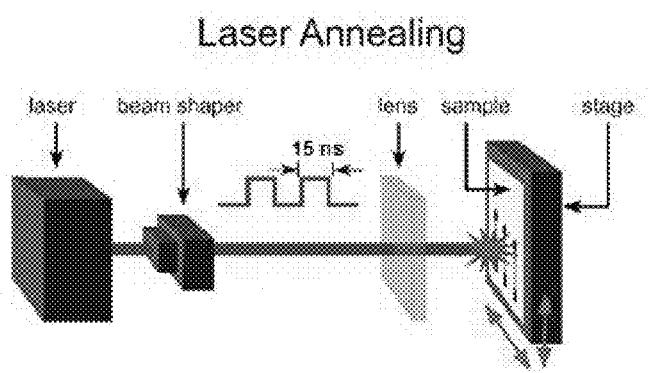

In general, an apparatus and system according to at least one aspect of the invention is illustrated in highly diagrammatic form at FIGS. 1a-c.

Ink formulation. An ink formulation (FIG. 1a) is created. In this example, single-layer graphene flakes of nano-scale form factor are mixed with other components to form an inkjet printable ink. A specific example of one such formulation will be described later.

Inkjet printer sub-system. A commercially-available inkjet printer (FIG. 1b) is utilized to deposit the ink onto a given substrate in a pre-determined pattern. As will be further discussed below, such patterns can be a single discrete shape on a substrate, multiple repeated shapes (such as mass production of plural identical electrodes that can later be singulated by known automated micro-manufacturing techniques, or complex images, circuits, or even continuous coatings.

Laser irradiation subsystem. A commercially-available laser, optics, and x-y translation stage (FIG. 1c), such as are known to those skilled in the art, can be configured to generate a pulsed laser that is controlled both in laser energy density and spatially relative to the printed pattern on the substrate. In the following examples, the laser has the following parameters:

| | |
|---|---|
| Laser beam diameter or area at the printed pattern | 0.28 cm$^2$ |
| Maximum power density | 10 MW/cm$^2$ |
| Maximum energy | 200 mJ/cm$^2$ |
| Repetition rate | 5 Hz |
| Pulse width | 15 ns |
| Wavelength | 355 nm (near UV) |
| Power density | 40-125 mJ/cm$^2$ |

To produce a variable controllable pulsed laser output, known driving components can be used. Similarly, known and commercially available programmable x-y stages can be used to translate the substrate, with its printed pattern, relative the laser so that a high degree of spatial resolution of the laser beam relative the printed pattern can be achieved.

The exemplary apparatus and system therefore enables both spatially selective annealing and tunable high energy short pulse duration laser energies relative the printed pattern. This includes on a variety of scales for bench top relatively small substrates to large scale automated manufacturing.

This also includes a wide variety of substrates. Non-flexible (e.g. silicon) are possible, as are flexible (e.g. paper or polymeric and even fabric). The system would be set up to hold the substrate on the x-y stage sufficiently to maintain good spatial resolution of the laser.

As will be discussed in the examples given below, the resulting tunable pulsed laser annealing in turn enables implementation into a wide variety of functional devices. Examples are printed circuits (whole or partially electrically connected) or discrete parts thereof (e.g. electrodes), sensor elements, coatings for surfaces, and other.

As mentioned earlier, alternatives are possible. For example, instead of inkjet printing, other forms of controllable deposition are possible such that the material can be applied to a substrate in a pattern or other form factor of the nature described herein. While FIG. 1 illustrates electrodes patterns on the substrate, the deposition can be in a variety of forms and form factors. Examples are circuits from simple to complex, complete continuous layers, and multiple layers whether continuous or patterned.

C. General Operation

In general, an apparatus and system according to aspects of the invention, as indicated above, can be operated at a wide variety of scales and a wide variety of printed patterns or generated forms (e.g. coatings) to have tunable outcomes relative to at least surface and electrical modification of graphene flakes within the printed pattern. This can include conductivity (including radical change), as well as shape and structures (including 3D nanostructures).

This new way or paradigm of post-processing inkjet printed graphene ink or other deposition on a substrate will be further understood with reference to the following specific exemplary embodiments and examples.

D. Specific Example 1

A specific exemplary embodiment according to aspects of the invention follows. See also Das, et al., 3D Nanostructured Inkjet Printed Graphene via UV-pulsed Laser Irradiation Enables Paper-based Electronics and Electrochemical Devices, *Nanoscale*, 2016, 8, 15870-15879, incorporated by reference herein.

Tunable 3D Nano-Structured Inkjet Printed Graphene Via UV Pulsed-Laser Irradiation for Electrochemical Sensing Inkjet-printed graphene has shown promise in the development of a wide range of low-cost, 'More-than-Moore' functional devices[1,2] including thin film transistors[3,4], acoustic actuators, dipole antennas[6], micro-supercapacitors[7], and chemical/temperature sensors[8,9]. In order to make such technologies viable, post-print thermal annealing and/or chemical reduction processes are employed to increase electrical conductivity and improve device performance[3,6,10]. However, these post-print processing steps can thermally or chemically degrade flexible and disposable substrates (e.g., cellulose-based paper, polymers) commonly used in emerging electronics. Post-print thermal annealing and chemical reduction methods are also whole substrate processes that are unable to selectively anneal/reduce the printed graphene and subsequently unable to leave device components that are sensitive to chemical or thermal degradation unharmed. Herein we show how the power density of a UV pulsed-laser (40-85 mJ cm$^{-2}$ at λ=355 nm wavelength & 15 ns pulse duration) can be tuned to realize both selective annealing and 3D nanostructuring of inkjet-printed graphene flakes or nanoplatelets. The printed graphene flake-to-flake physical boundaries are 'stitched,' smoothed, and converted into 3D graphene 'petals' with corrugated features consisting of wrinkles and ridges within the graphene microstructure. These visible morphological changes improve the electrical conductivity of the printed graphene by three orders of magnitude ($R_{sheet\ (paper\ substrate)}$) ~0.7 kΩ/□, a sheet resistance lower than previous reports) and enable highly favorable electrochemical sensing characteristics [ferricyanide redox peak separation (ΔEp)≈0.7 V] and sensitive (3.32 µA mM$^{-1}$/<5 s) hydrogen peroxide ($H_2O_2$) sensing.

Improving the electrical conductivity of inkjet-printed graphene or graphene oxide is typically carried out through the following post-print techniques: high temperature thermal annealing (170-400° C.)[3,10,11], mild temperature thermal annealing (90° C.) combined with hydrazine vapor deposition[5], and more recently pulsed light annealing with a xenon lamp[11]. These techniques are focused on improving the electrical conductivity of printed graphene by removing nonconductive ink binders (e.g. ethyl cellulose) and/or reducing graphene oxide to graphene. Herein we demonstrate how pulsed UV laser irradiation overcomes the shortcomings and significantly improves upon conventional post-print annealing techniques via printed graphene flake nanostructuring (i.e., removing flake-to-flake resistance by stitching graphene flake boundaries and transforming a planar 2D printed surface into a highly electrocatalytic 3D structure with corrugated-like graphene ridges and petals) for rapid and sensitive electrochemical sensing.

Topological graphene defects found in ridge planes/petals or wrinkles (i.e., edge plane graphene) are highly responsive to electrical/electrochemical sensing. Edge-plane graphene, where defects in the C—C bonds are present, displays a significant increase in heterogeneous electron transfer rates as compared to defect-free basal plane graphene[12-16]. For example, edge-plane graphene can display upwards of 300 times the sensitivity of basal plane graphene in the detection of gas molecules and chemical analytes[17]. Here, we use a high-power third harmonic Nd:Yag laser (355 nm excitation wavelength with 15 ns pulse width and varying laser energies between 40-85 mJ cm$^{-2}$) to smooth the graphene flake-flake boundaries throughout the printed graphene pattern and induce high surface area topological defects (i.e., 3D petal structures) on thermally and chemically sensitive electrode substrates such as cellulose-based paper and flexible polyimide surfaces. This tunable, 3D nanostructuring of inkjet-printed graphene displays favorable electrochemical sensing without the need for graphene nitrogen doping[18,19] or metallic nanoparticle integration[20,21].

Laser irradiation of the printed graphene electrodes was conducted with a Nd:Yag laser (λ=355 nm, 15 ns pulse width, 5 Hz repetition rate) (see 'Experimental' section) at four distinct laser power densities: 40 mJ cm$^{-2}$, 55 mJ cm$^{-2}$, 70 mJ cm$^{-2}$ and 85 mJ cm$^{-2}$ (Supporting Information S1). A laser with a spot size of ~0.28 cm$^{-2}$ (size is tunable via the focus lens system) was selectively rastered across the graphene electrode in both the X and Y directions via a computer-controlled stage. Such a controlled laser process permits selective annealing of small regions of the printed graphene as the laser can be precisely controlled to avoid passing over and subsequently destroying sensitive device components or exposed substrate surface. The sheet resistance of the printed graphene electrodes after laser annealing was approximately 0.7 kΩ/□ and 1 kΩ/□ for graphene printed on paper based substrates and polyimide, respectively. Thus, the laser annealing process improves the electrical conductivity of the printed graphene electrodes by nearly three orders of magnitude as the unannealed graphene printed on both substrates was approximately 10 MΩ/□. It should be noted here that the improved/lower sheet resistance values of the laser annealed graphene are similar to the sheet resistance of single atomic layer graphene sheets grown by chemical vapor deposition (CVD) methods[22]—making the laser annealed, printed graphene a viable alternative to time-consuming, expensive CVD processing. The laser power density of 85 mJ cm$^{-2}$ was found to yield the most improvement in the electrical conductivity of the printed graphene [further increases in laser power displayed no significant improvement in electrical conductivity and began to degrade the electrode (data not shown)] while a printed graphene thickness of ~3.5 μm, viz., 60 printer passes, was the minimum printed graphene thickness that could withstand this high laser annealing power density without electrode degradation or loss of conductivity. Therefore, the analysis presented herein will be conducted with printed graphene electrodes that are fabricated with 60 printer passes.

Figure 5A:
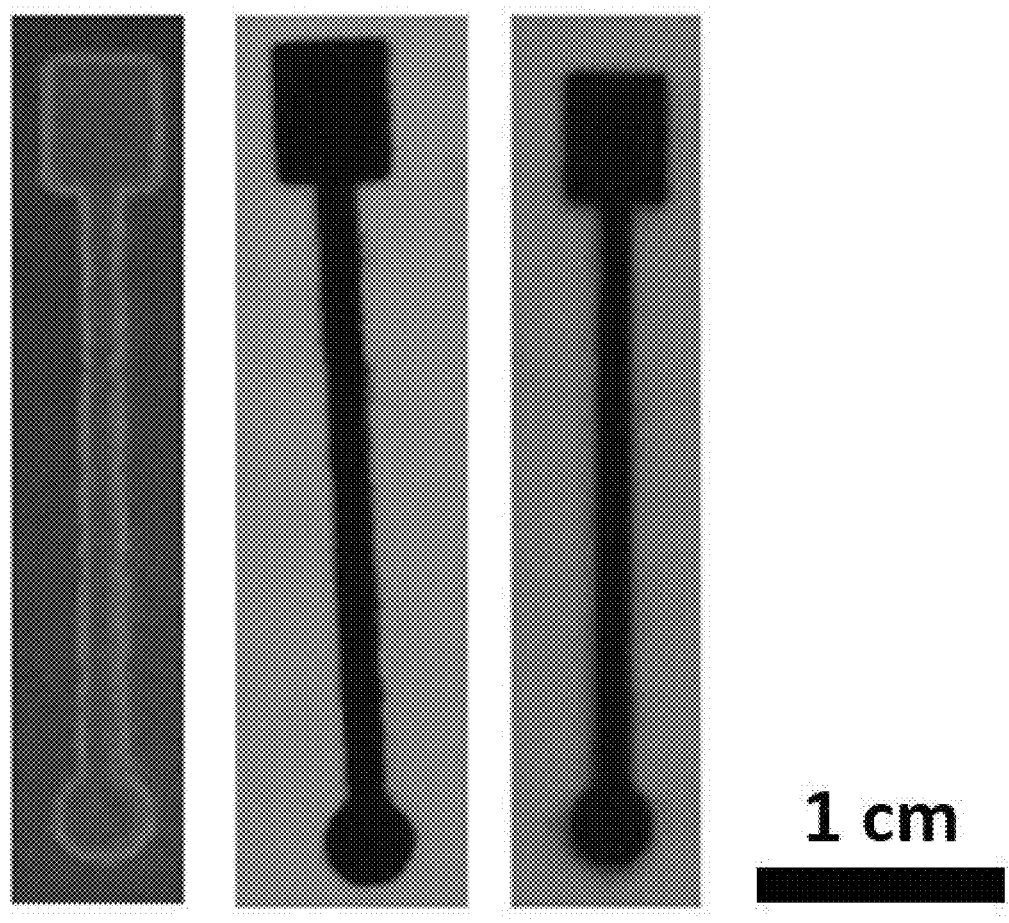
FIG. 5A is are greatly enlarged images of electrodes produced according to an exemplary embodiment of the present invention.

Printable graphene ink was formulated and printed following similar recipes reported previously[10]. In short, single layer graphene (SLG) powder was uniformly dispersed in solvents (15:85 vol./vol. ratio of terpineol to cyclohexanone)[10] and then bath and probe sonicated (see 'Experimental' for details & FIG. 1a). The resultant graphene ink mixture (~2 mL) was loaded into a Fujifilm Dimatix printer cartridge and the piezoelectric transducer nozzle voltage was manipulated for uniform pattern writing on each distinct printing substrate (see 'Experimental' & FIG. 1b). The thickness of the printed graphene was varied by controlling the number of printing passes or sweeps (i.e., 20, 30, 40, 50, and 60 passes). The average thickness of each printed graphene electrode was measured using an optical profilometer (average thickness of 60 total passes is ~3.5 μm, FIG. 5B in Supporting Information section infra.). The graphene electrodes were printed on both 25 μm thick flexible polyimide tape and 100 μm thick flexible, cellulose-based photo paper (FIG. 1e-1h; FIG. 5A in Supporting Information section infra.). The printed graphene retained its electrical conductivity in both flattened and bent states as 2-terminal resistance measurements remained the same during repeated bending and flattening [approximately 10 MΩ & 20.5 MΩ for graphene printed on polymide and paper, respectively (FIG. 1h & FIG. 5C in Supporting Information section infra.)]. Furthermore, the printed graphene electrodes retained their electrical conductivity (~20.5 MΩ sheet resistance for graphene printed on photo paper, FIGS. 1g & 1h) after hand scrubbing with liquid detergent, rinsing with DI water, and drying with a nitrogen gun (FIGS. 1g & 1h). The mechanical and environmental resilience of the printed graphene electrodes demonstrates the potential for a diverse array of applications such as flexible electronics and wearable sensing.

Laser irradiation of the printed graphene electrodes was conducted with a Nd:Yag laser (λ=355 nm, 15 nm pulse width, 5 Hz repetition rate) (see 'Experimental' section) at four distinct laser power densities: 40 mJ cm$^{-2}$, 55 mJ cm$^{-2}$, 70 mJ cm$^{-2}$ and 85 mJ cm$^{-2}$ (Supporting Information S1). A laser with a spot size of ~0.28 cm$^2$ (size is tunable via the focus lens system) was selectively rastered across the graphene electrode in both the X and Y directions via a computer-controlled stage. Such a controlled laser process permits selective annealing of small regions of the printed graphene as the laser can be precisely controlled to avoid passing over and subsequently destroying sensitive device components or exposed substrate surface. The sheet resistance of the printed graphene electrodes after laser annealing was approximately 0.7 kΩ/□ and 1 kΩ/□ for graphene printed on paper based substrates and polyimide, respectively. Thus, the laser annealing process improves the electrical conductivity of the printed graphene electrodes by nearly three orders of magnitude as the unannealed graphene printed on both substrates was approximately 10 MΩ/□. It should be noted here that the improved/lower sheet resistance values of the laser annealed graphene are similar to the sheet resistance of single atomic layer graphene sheets grown by chemical vapor deposition (CVD) methods[22]—making the laser annealed, printed graphene a viable alternative to time-consuming, expensive CVD processing. The laser power density of 85 mJ cm$^{-2}$ was found to yield the most improvement in the electrical conductivity of the printed graphene [further increases in laser power displayed no significant improvement in electrical conductivity and began to degrade the electrode (data not shown)] while a printed graphene thickness of ~3.5 viz., 60 printer passes, was the minimum printed graphene thickness that could withstand this high laser annealing power density without electrode degradation or loss of conductivity. Therefore, the analysis presented herein will be conducted with printed graphene electrodes that are fabricated with 60 printer passes.

Figures 2A, 2B, 2C, 2D, 2E, 2F, 2G, 2H:
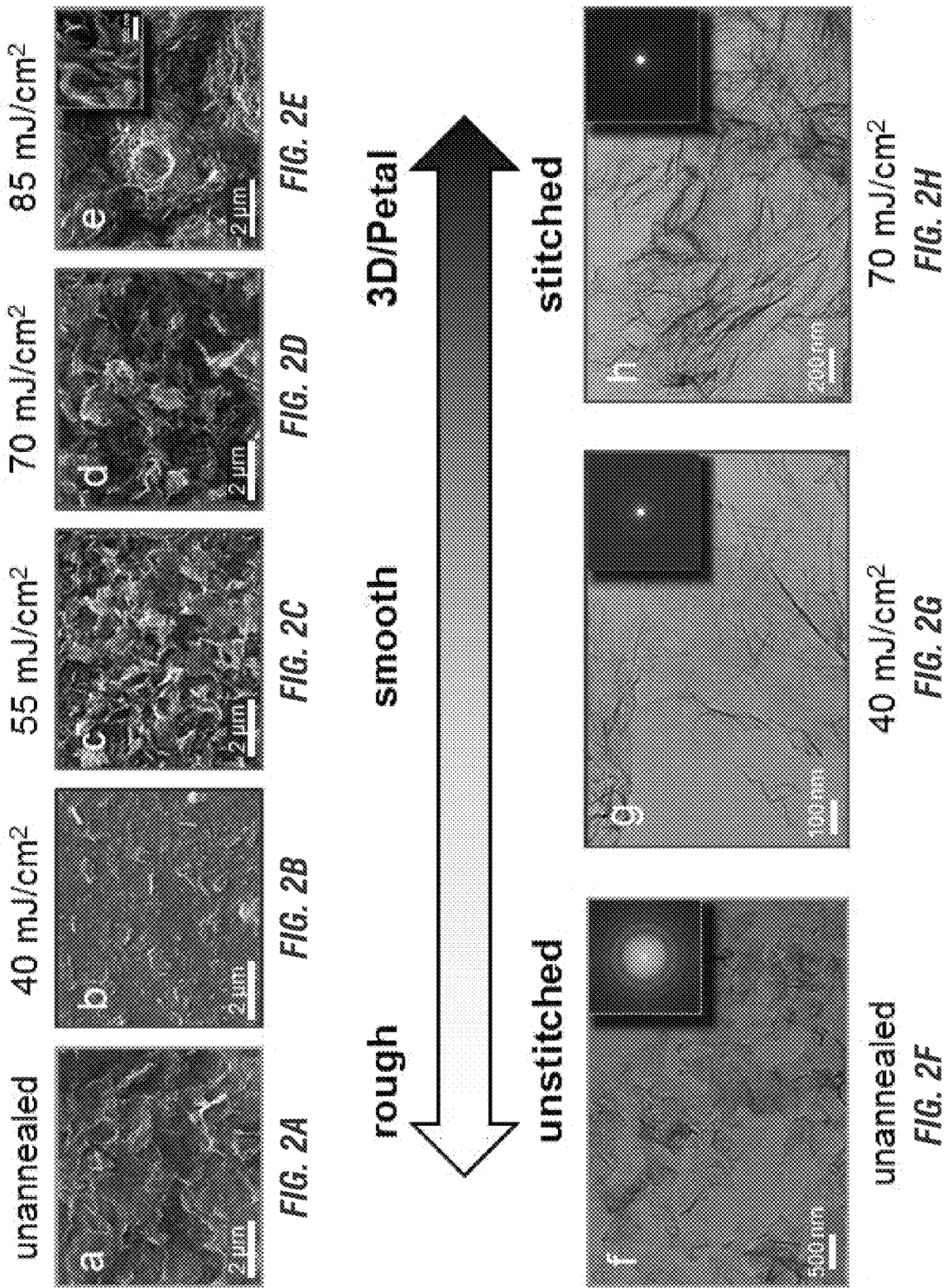
FIGS. 2A-E are photos of images at small scale of the surface of a printed pattern showing change in morphology over a range of unannealed to increasing laser power levels.
FIGS. 2F-H are transmission electron micrograph images at the nanoscale that show the stitching or welding of individual graphene flakes after pulsed laser annealing.

FIG. 2 illustrates the following: (a)-(e) Scanning electron microscope images of an as-printed graphene electrode and the electrodes annealed with 40, 55, 70, and 85 mJ cm$^{-2}$ energy densities are shown respectively. Upon annealing at 40 mJ cm$^{-2}$ the electrode surface microstructure smoothens (more 2D planar structure) after which it gradually transforms into 3D 'Petal' structures (FIGS. 2c, d, and e). While a lower energy density (c) produces random petal orientations, they acquire a uniform, nearly vertical orientation at higher energy densities (e). Inset (e) shows the thickness of an individual petal ~50 nm; (f)-(h) Transmission electron microscope images of inkjet-printed graphene (2 printing passes only) with unannealed and laser annealed conditions with energy density of 40 mJ cm$^{-2}$ and 70 mJ cm$^{-2}$ are shown. Individual graphene flakes are visible in the unannealed printed electrode (f); however, the flake-flake physical boundaries are stitched together in the laser annealed electrodes. Moreover, topological defects including wrinkles and ridges appear on the graphene with increasing laser energy. These, along with the edge states in the petal structures, are responsible for the enhanced electrochemical sensing of atoms and molecules.

The laser annealing process creates significant and tunable changes to both the micro and nanostructure of the printed graphene electrodes [see scanning electron microscopy (SEM) and transmission electron microscopy (TEM) experiments in FIG. 2]. The surface microstructure of the unannealed printed graphene electrode is rough with densely packed individual graphene flakes linked together with ethyl cellulose surfactants (FIG. 2a). This rough interface between the graphene flake-to-flake boundaries as well as the presence of binding materials are the primary reasons for the high resistance of unannealed printed graphene (FIG. 1d). The surface microstructure of the printed graphene electrode starts to become smooth with the physical joining of individual flakes at the lowest laser power density (40 mJ cm$^{-2}$, FIG. 2b). At higher laser power densities, namely 55 mJ cm$^{-2}$, 70 mJ cm$^{-2}$, and 85 mJ cm$^{-2}$, the surface of the graphene electrode transforms from a planar 2D structure to a petal-like 3D structure (FIGS. 2c-2e). As the power density increases to 85 mJ cm$^{-2}$ the 3D graphene petals appear to be denser and more isotropic in orientation as compared to graphene petals annealed at lower laser power densities (FIG. 2e and FIG. 5D in Supporting Information section infra.). Previous laser scribing and writing techniques have primarily focused on patterning graphene onto substrate surfaces, but this work demonstrates for the first time how direct laser energy densities can be varied to tune the morphology, electrical conductivity, and electroactivity of graphene[23,24]. It should also be noted that our laser technique utilizes power densities that are several orders of magnitude higher than those previously used in laser scribed graphene oxide (LSGO) (Table S1, infra)[23, 24]. Subsequently, these higher UV power densities enable us to create 3D graphene petal structures of 25-50 nm thickness (see FIG. 2e & Supporting Information section infra.) as compared to the larger micron-sized porous graphene structures reported by the LSGO technique[24, 25]. In this regard, this laser annealing technique is truly capable of nanostructuring the graphene surface.

In order to better understand the nanostructuring of the printed graphene, TEM micrographs were obtained of unannealed graphene and graphene laser annealed with power densities of 40 mJ cm$^{-2}$ and 70 mJ cm$^{-2}$ respectively (FIGS. 2f-2h). Distinct individual flakes of the unannealed graphene TEM sample are optically transparent, structurally flat, and nearly identically sized to the original graphene powder used in the ink formulation—graphene flake lateral size is in the range of 500 nm-1 μm (FIG. 2f. However, individual graphene flakes are not visibly apparent in the representative TEM image of printed graphene annealed at 40 mJ cm-2; a continuous, single-sheet of graphene begins to form within the printed graphene as it is laser annealed at 40 mJ cm$^{-2}$ (FIG. 2g). This TEM micrograph clearly demonstrates the joining/welding of the flake-flake boundaries to form a continuous sheet of graphene and explains the increase in the electrical conductivity upon laser annealing. In addition to joining or welding flake-flake physical boundaries, the incident laser power creates a large number of topological imperfections on the graphene lattice including interconnected lines and corrugated structures that are similar in appearance to the wrinkles and ridges typically found on large scale CVD graphene[22]. The density of these corrugated structures significantly increases as the laser annealing power density is increased to 70 mJ cm$^{-2}$. Thus, the ability of the laser annealing process to stitch or weld graphene flake-to-flake boundaries and create 3D structures is evident on both micro and nanoscale imaging.

Next, Raman spectroscopy and x-ray photoelectron spectroscopy (XPS) were employed to analyze the atomic structure of the unannealed and laser annealed printed graphene substrates.

FIG. 3 illustrates the following: (a) Raman spectra of as-printed and laser annealed graphene electrodes. The as-printed electrode resembles a graphitic structure and as the laser annealing energy increases, the 2D Raman peak develops, the D peak intensity decreases and the G peak becomes sharper, indicating the transition to a honeycomb lattice, which is signature of laser annealed graphene electrodes; (b)-(f) The XPS spectra of the unannealed and laser annealed electrodes with energy densities of 40 mJ cm$^{-2}$, 55 mJ cm$^{-2}$, 70 mJ cm$^{-2}$, and 85 mJ cm$^{-2}$, respectively. The unannealed graphene electrode shows primarily a C—O bonding signature but with increasing laser energy the C—O signature disappears above 55 mJ cm$^{-2}$, forming a honeycomb C—C bond.

Figure 3A:
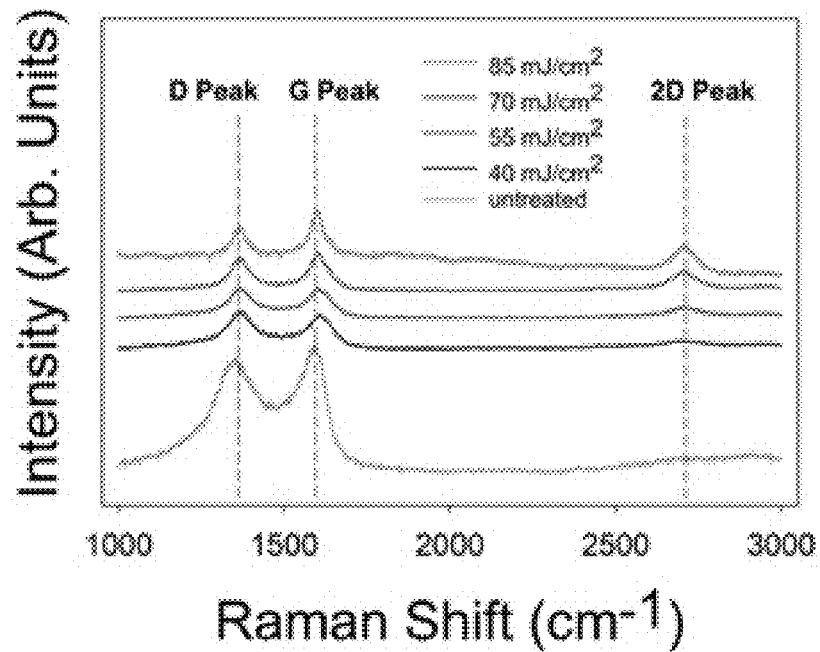
FIG. 3A is a graph showing proof of concept via Raman spectroscopy and FIGS. 3b-f are graphs showing proof of concept via x-ray photoelectron spectroscopy (XPS) of the printed pattern over a range of unannealed to increasing laser power levels.
Figure 3B:
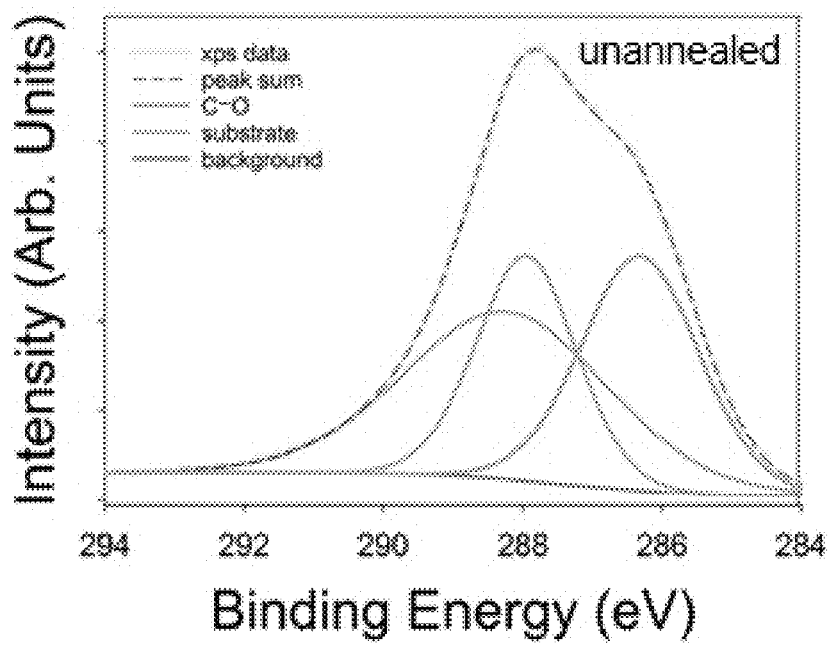

FIG. 3a displays the Raman spectra collected from all substrates (unannealed and annealed with laser power densities of 40 mJ cm$^{-2}$, 55 mJ cm$^{-2}$, 70 mJ cm$^{-2}$ and 85 mJ cm$^{-2}$) with a backscattered geometry and 532 nm excitation laser source (see 'Experimental'). The unannealed printed graphene substrates display a prominent G peak and D peak, two characteristic peaks associated with graphene. However, the 2D peak also associated with graphene is not visible with the unannealed graphene samples; the 2D peak only develops after laser annealing. The position or Raman shift of the G, D, and 2D peaks for laser annealed samples are found in the following ranges: D peak between 1353 cm$^{-1}$ and 1365 cm$^{-1}$; G peak between 1593 cm$^{-1}$ and 1608 cm$^{-1}$; and the 2D peak between 2702 cm$^{-1}$ and 2704 cm$^{-1}$. These peak positions are characteristic of Raman spectra reported for single-layer graphene (~1350 cm$^{-1}$, 1580 cm$^{-1}$ and 2700 cm$^{-1}$ for the D, G, and 2D peaks respectively)[26]. Subsequently, the intensity decrease in the D peak, which is a disorder induced peak, and the gradual appearance of the 2D peak with increasing laser annealing power also point to the formation of graphene-like structures. The gradual decrease of the ratio I(D)/I(G) indicates the presence of edge-induced defects rather than basal plane defects[27]. Such edge-induced defects will be important to electrochemical sensing measurements displayed in FIG. 4 and discussed in subsequent sections.

Figure 3C:
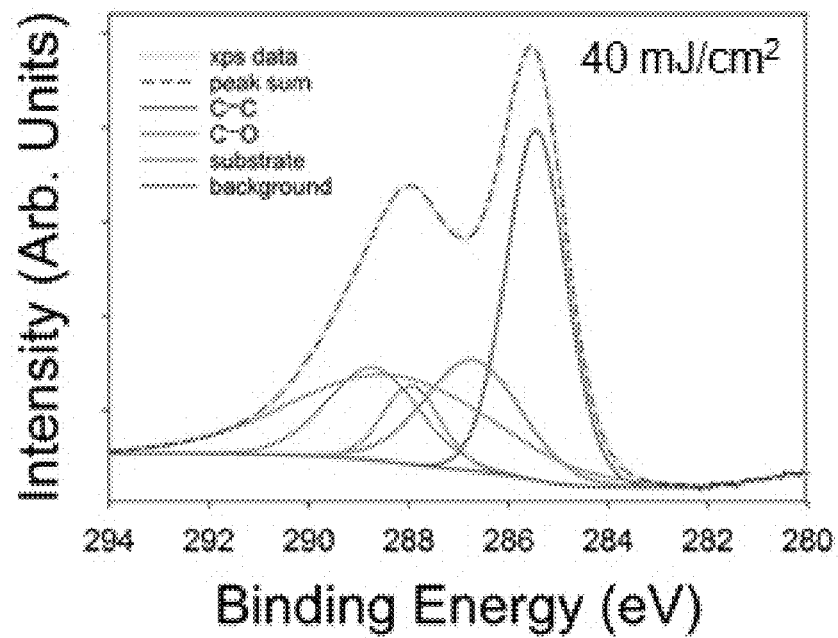
Figure 3D:
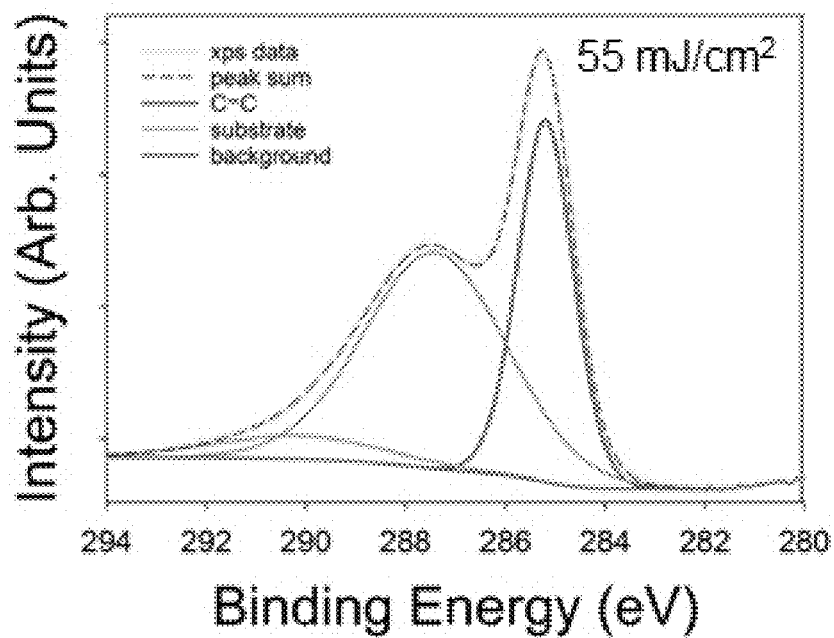
Figure 3E:
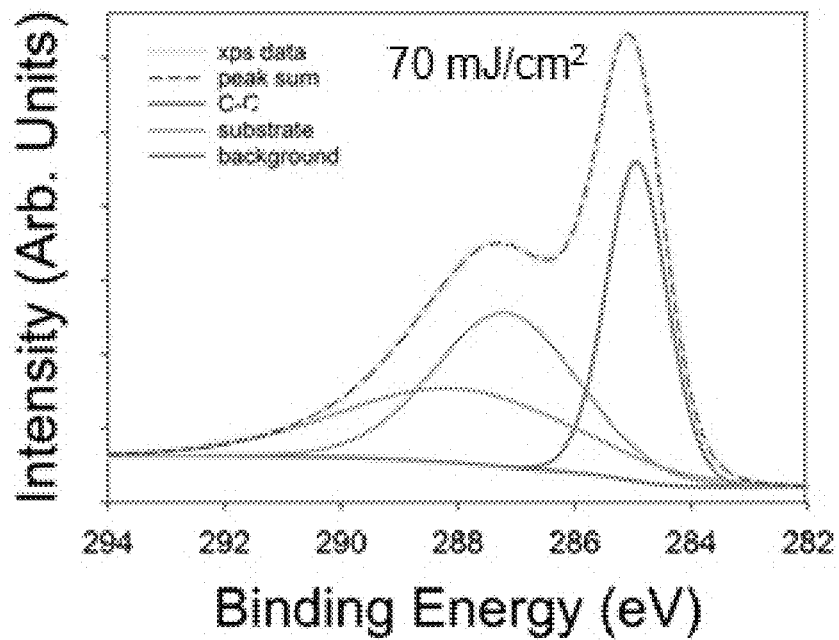
Figure 3F:
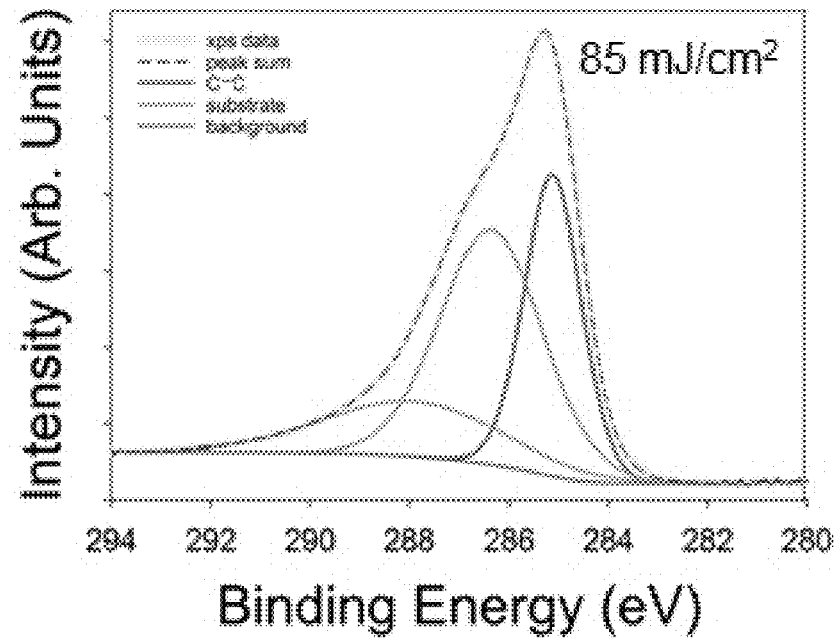
Figure 4A:
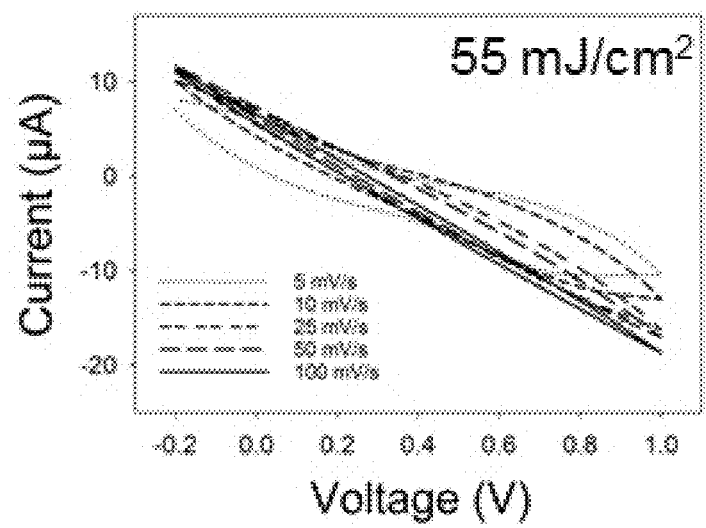
FIGS. 4A-F are electrochemical scans (i.e., cyclic voltammetry) increasing electrochemical conductivity of the printed graphene with increasing laser anneal power.
Figure 4B:
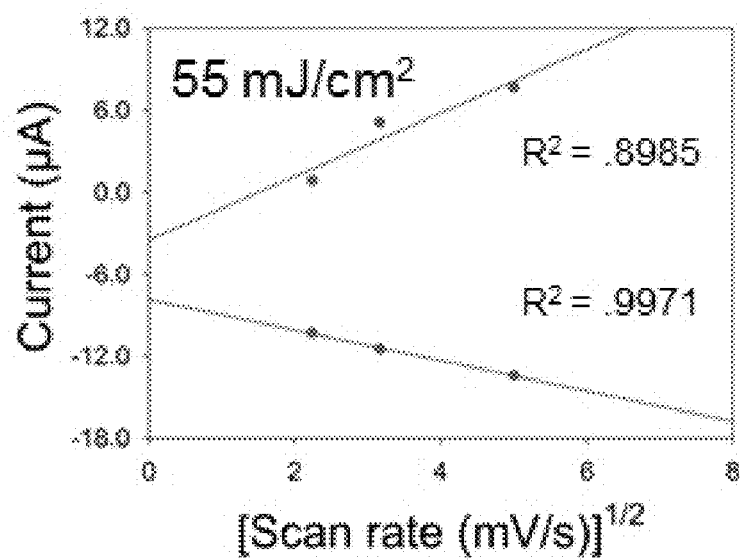
Figure 4C:
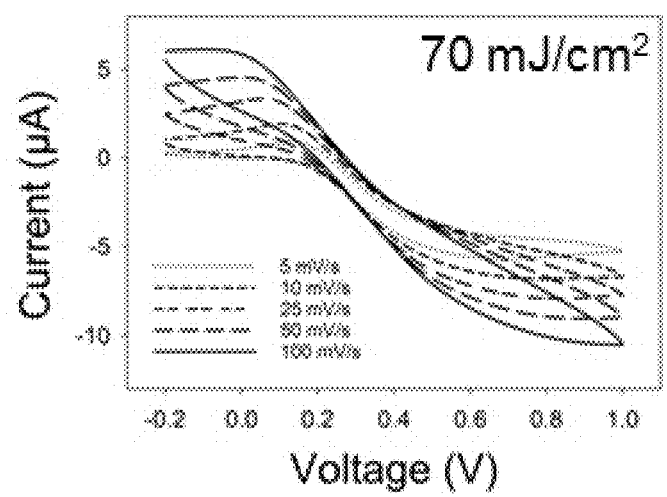
Figure 4D:
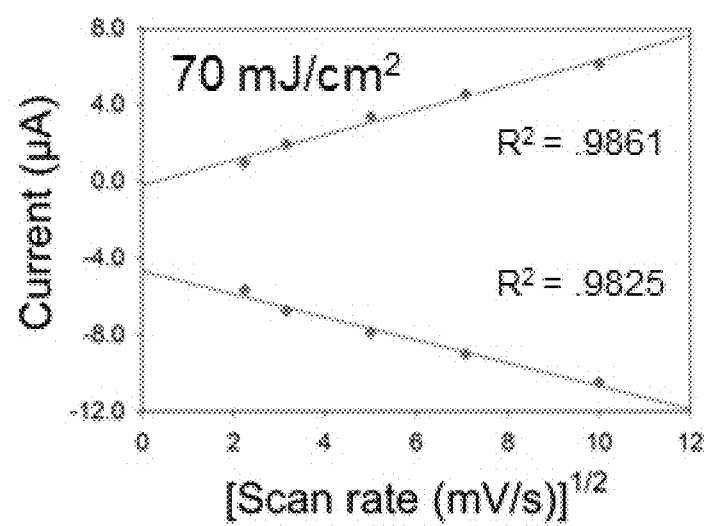
Figure 4E:
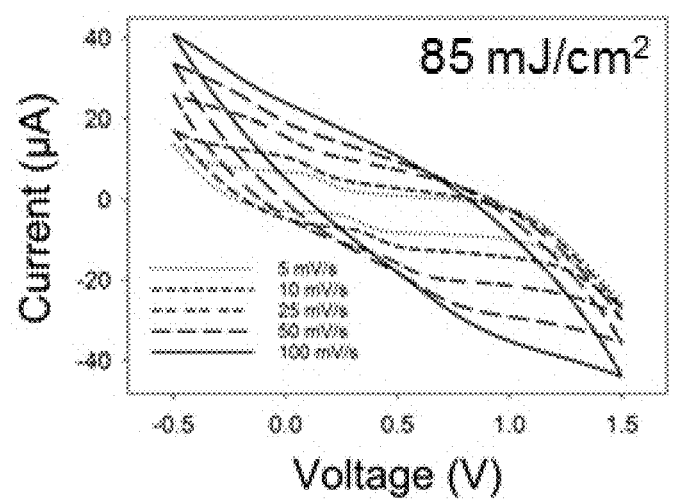
Figure 4F:
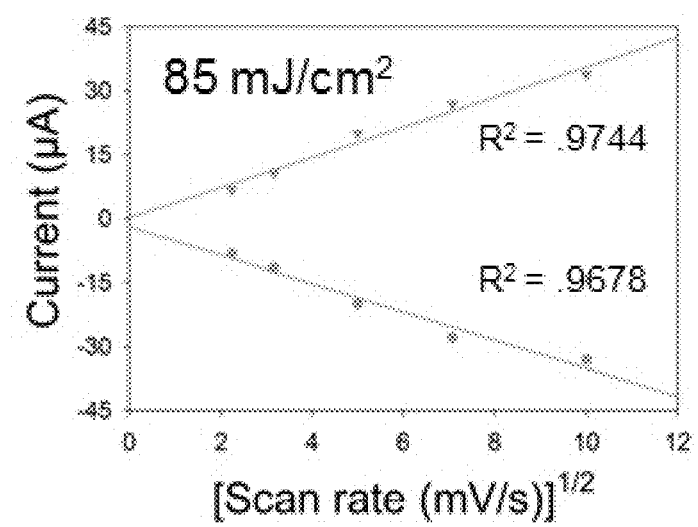
Figure 4G:
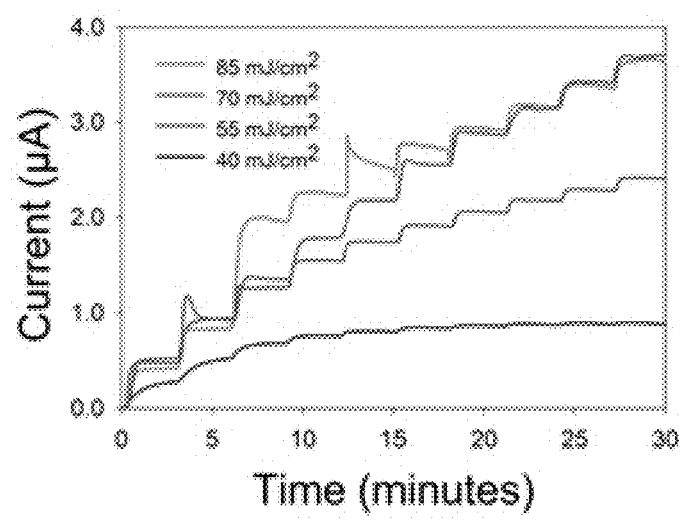
FIGS. 4G-H show additional electrochemical measurements (i.e., amperometry) that displays how the hydrogen peroxide sensitivity of the graphene electrodes increases as the power of the annealing laser is tuned.
Figure 4H:
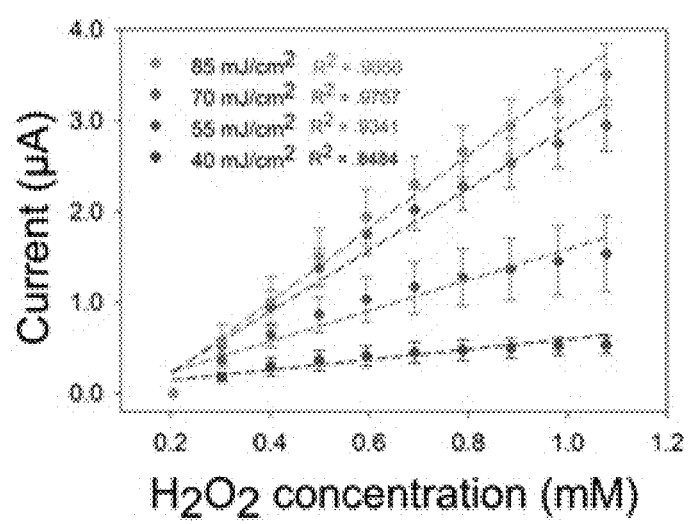

The C1s XPS spectra was also obtained for the unannealed printed graphene and for printed graphene annealed with laser power densities of 40 mJ cm$^{-2}$, 55 mJ cm$^{-2}$, 70 mJ cm$^{-2}$, and 85 mJ cm$^{-2}$ (FIGS. 3b-3f). The C1s peak was analyzed for each electrode via deconvolution of the data using Lorenzian peak fitting with constituent peaks while discarding the presence of the background peaks and substrate peaks (in our case, the substrate was cellulose-based photo paper). The unannealed printed graphene displayed mostly C—O bonding which indicates the presence of oxygen functional groups attached to the honeycomb lattice[28]. This might arise from the various process-induced oxidations in our ink preparation and/or writing or binder materials. However, upon laser annealing with the lowest energy density of 40 mJ cm$^{-2}$ as shown in FIG. 3c, the C—C bonding appears while the intensity of C—O decreases. With increasing laser energy density, the C—O signature gradually disappears and only the C—C bonding signatures remain in the C1s spectrum above 55 mJ cm$^{-2}$ annealing energy density[28]. This clearly demonstrates the role of pulsed laser annealing of printed graphene not only for nanostructuring but also for transforming the material into sp$^2$-honeycomb lattice with edge 3D defected structures. As discussed in the next section, these structural transformations in the printed graphene after laser annealing have a significant effect on electrochemical sensing.

FIG. 4 illustrates the following: Cyclic voltammograms (CVs) of the inkjet-printed graphene electrodes that were laser annealed at a power density of (a) 55 mJ cm$^{-2}$, (c) 70 mJ cm$^{-2}$ and (e) 85 mJ cm$^{-2}$ and (b, d, f) corresponding Randles-Sevcik plots showing linear regression analyses of current versus scan rate, respectively. CV scans were conducted in 4 mM Fe(CN)$_6^{3-}$ and 1 M KNO$_3$ at a potential scan that is cycled between ~0.2 V and 1.0 V versus an Ag/AgCl reference electrode at five distinct scan rates-5 mV/s (red), 10 mV/s (orange), 25 mV/s (purple), 50 mV/s (green), and 100 mV/s (blue). (g) Amperometric sensing of hydrogen peroxide (H$_2$O$_2$) with inkjet-printed graphene electrodes laser annealed at distinct power densities of 85 mJ cm$^{-2}$ (green), 70 mJ cm$^{-2}$ (red), 55 mJ cm$^{-2}$ (purple), 40 mJ cm$^{-2}$ (blue) and (h) corresponding linear regression analysis of the current versus concentration. The concentration of $H_2O_2$ was incrementally increased with concentration steps of 0.1 mM within a test vial containing 10 mL of phosphate buffer solution (PBS).

The electroactive nature of the printed graphene electrodes are first characterized via cyclic voltammetry (CV) versus an Ag/AgCl (3M NaCl) reference electrode. The unannealed graphene electrodes and those that were laser annealed with the low energy density of 40 mJ cm$^{-1}$ (see Supporting Information) exhibit negligible or approximately constant current increase/decrease with cycling voltage. Such typical unsteady-state behavior is most likely due to the high electrical resistance associated with the presence of the polymer binder, viz., ethyl cellulose, and high boundary layer resistance associated with 'unstitched' graphene (FIG. 1d & FIG. 2). However, the printed graphene electrodes that were laser annealed with 55 mJ cm$^{-2}$, 70 mJ cm$^{-2}$, and 85 mJ cm$^{-2}$ respectively, exhibit reversible behavior with increasing laser annealing energy density as the Randles-Sevcik plots display a linear relationship between the anodic and cathodic peak currents to the square root of the scan rate (Ip~v$^{1/2}$) [FIGS. 4b, 4d, & 4f; only at lower scan rates (i.e., 5, 10, & 25 mV s$^{-1}$)]. Of particular interest is the printed graphene electrode laser annealed at 70 mJ cm$^{-2}$ where well-defined oxidation and reduction peaks appear at approximately 0.8 and 0.1 V (scan rate of 10 mV/s) due to the $Fe^{3+}/Fe^{2+}$ redox couple. This peak-to-peak separation ($\Delta Ep$) of 0.7 V is indicative of fast and reversible heterogeneous electron charge transfer at room temperature[29].

The amperometric sensing of $H_2O_2$ oxidation is next performed to further characterize the electroactive nature of the laser annealed printed graphene electrodes and demonstrate the utility of the printed graphene in electrochemical sensing and catalysis. The oxidation of $H_2O_2$ plays a vital role in a wide range of applications from small-scale (micro & nanoscale) propulsion of underwater vehicles to electrochemical biosensing[30,20]. With regards to the latter, $H_2O_2$ acts as an electrochemical transducer between pertinent oxidoreductase enzymes (e.g., glucose oxidase, glutamate oxidase, lactate oxidase, and alcohol oxidase) in the presence of oxygen; the electrochemical sensing of $H_2O_2$ is pivotal to numerous enzyme-based biosensors. The sensitivity of $H_2O_2$ oxidation at the electrode surface increases approximately by three-fold from 0.54 µA mM$^{-1}$ to 1.67 µA mM$^{-1}$ with a laser annealing power density of 40 mJ cm$^{-2}$ to 55 mJ cm$^{-2}$, and further increases two-fold to 3.32 µA mM$^{-1}$ with 85 mJ cm$^{-2}$. As with cyclic voltammetry, the amperometric sensitivity of the printed graphene electrodes reaches a plateau at a laser annealing power density of 70 mJ cm$^{-2}$ with negligible/incremental improvement in sensitivity (3.99 µA mM$^{-1}$) at 85 mJ cm$^{-2}$.

In summary, we have developed and demonstrated a scalable and tunable manufacturing process for 3D nanostructured inkjet-printed graphene on both rigid and flexible substrates respectively. The optimal laser energies (alternatively, power densities) of the UV pulsed laser provide a superior percolating network path for electronic transport as well as coherently transform the network into a 3D petal structure that is shown to be well-suited for electrochemical sensing. The enabling new manufacturing method of pulsed-laser annealing opens the door to such graphene electrode fabrication protocols and accordingly feasible commercial production of numerous graphene-based applications including flexible, wearable, and disposable fuel cells and chemical/biological sensors.[31-33]

Experimental

I. Fabrication:

Graphene ink formulation: Inkjet-printable graphene ink was formulated by mixing single-layer graphene (SLG) powder (ACS Materials, Inc.) with solvent [with 85% cyclohexane (Sigma-Aldrich) to 15% terpineol (Sigma-Aldrich) volume/volume)] via vortex mixing for 1 minute and at a concentration of 3.5 mg/mL (graphene/solvent). Ethyl Cellulose [viscosity 46 cP, 5% in toluene/ethanol 80:20(lit.), Sigma-Aldrich 433837) was subsequently added to the mixture (also at a concentration of 3.5 mg/mL) and the resultant solution was vortex mixed for 5 minutes at high speed. The graphene ink was then probe-sonicated (Sonics Vibra-cell VCX-750 ultrasonic processor) for 30 minutes to break up any large particles and then bath sonicated for 21 hours. The solution was finally filtered through a 0.45 µm syringe filter to rid the solution of micron-sized particles.

Graphene printing: The resultant ink was loaded into a printer cartridge with 10 pL nominal drop volume nozzles and printed via a Fujifilm Dimatix Materials Inkjet Printer (DMP2800). The graphene ink was printed onto both flexible polyimide (Kapton: thickness of 25 µm) and flexible Kodak photo paper (thickness of 100 µm). The waveform was optimized to print the graphene ink at 30° C. with a 40 µm drop spacing. These parameters yielded consistent and well-defined lines that held tightly to the substrate without an undesirable 'coffee ring' effect.

Laser annealing: An Nd:Yag laser with third harmonic and UV excitation at 355 nm was used to anneal and nanostructure the inkjet-printed electrodes. A pulse width of 15 ns was adjusted with a repetition rate of 5 Hz and total exposure time of 20 s for each laser spot. The laser spot size was adjusted to 0.28 cm$^2$ at the focal point situated on the inkjet-printed graphene surface. A computer-controlled XY motorized stage rastered the laser beam over the entire surface area of the graphene electrodes with minimal overlapping of the exposure area. The laser annealing experiment was performed in ambient conditions.

II. Characterization:

Sheet resistance measurements: The sheet resistance of each graphene printed electrode was measured with the Jandel Multi Height Probe that contained the RM3000 Test Unit. For each electrode, the measurements were performed at five different areas and the mean sheet resistance was calculated and reported.

Thickness measurements: The thickness of the printed graphene patterns was measured using a surface profilometer (Ambios technology, XP 100). A control measurement was acquired by measuring a standard 900 nm step height with a 10 µm scale calibration test before graphene steps were measured.

Raman spectroscopy: Confocal Raman microscope micrographs were obtained with a Horiba Xplora Raman spectrometer equipped with a motorized sample stage from Marzhauser Wetzlar. Raman spectrum of the electrodes was measured in backscattered configuration with 532 nm laser excitation.

X-ray photoelectron spectroscopy (XPS): The XPS spectrum of the printed graphene was measured using a Kratos Amicus X-ray Photoelectron Spectrometer containing an Al Kα excitation source (1486.7 eV). The binding energy survey scan was created by measuring the photoelectron energies from the constituent elements and subtracting the excitation energy from the scan. The C1s spectrum was analyzed for the graphene structure. CasaXPS software package was used for Shirley background fitting and Gaussian Lorentzian line peak fitting on relevant constituent peaks.

Scanning electron microscopy (SEM) & Transmission electron microscopy (TEM): The micro/nano structures were investigated using a Field Emission Scanning Electron Microscope (FE-SEM) [FEI Quanta 250] and a Transmission Electron Microscope (TEM) [FEI Tecnai G2 F20]. FE-SEM images were captured in secondary electron (SE) mode using 10 kV accelerating voltages and sample distance of ~10 mm (working distance) from the field emitter source aperture. The TEM images were captured at 100 kV accelerating voltages. TEM samples were prepared using pelco copper TEM grids with lacey carbon support (Ted Pella Inc.) after inkjet printing two passes of graphene ink onto them. The number of printing passes on the TEM grids was limited to two in order to ensure visible imaging during TEM analysis.

Cyclic voltammetry (CV) scans: CV tests were performed on graphene electrodes (one unannealed electrode and four laser annealed with laser power densities of 40 mJ cm$^{-2}$, 55 mJ cm$^{-2}$, 70 mJ cm$^{-2}$, 85 mJ cm$^{-2}$ respectively) printed on polyimide substrates with 60 printing passes. CV scans were acquired in a 3-electrode set-up in a test vial of 10 mL of 1 M KCl with 20 µL of 0.5 M $K_4Fe(CN)_6$ connected to a CHI instruments potentiostat (660 series). The graphene acted as the working electrode, Ag/AgCl (3M NaCl) as the reference electrode, and a platinum wire as the auxiliary electrode. Each graphene electrode was tested with following five distinct CV scan rates: 5 mV/s, 10 mV/s, 25 mV/s, 50 mV/s, and 100 mV/s.

Hydrogen Peroxide ($H_2O_2$) sensing. Amperometric $H_2O_2$ sensing was acquired in a 3-electrode set-up electrically connected to a CHI instruments potentiostat (660 series) and submerged in a test vial of 10 mL of 1× phosphate buffer solution (PBS). The graphene acted as the working electrode, Ag/AgCl (3M NaCl) as the reference electrode, and a platinum wire as the auxiliary electrode. Incremental hydrogen peroxide concentration increases were added to the test vial by pipetting 10 µL of $H_2O_2$ ten times from the following four distinct $H_2O_2$ stock solutions: 1 mM, 10 mM, 100 mM, and 1 M, respectively. A working potential of 0.5 V between the working and auxiliary electrodes was maintained during experiments.

[1] F. Torrisi, J. N. Coleman, Nat. Nanotechnol. 2014, 9, 738.
[2] K. S. Novoselov, V. Fal, L. Colombo, P. Gellert, M. Schwab, K. Kim, Nature 2012, 490, 192.
[3] F. Torrisi, T. Hasan, W. Wu, Z. Sun, A. Lombardo, T. S. Kulmala, G.-W. Hsieh, S. Jung, F. Bonaccorso, P. J. Paul, D. Chu, A. C. Ferrari, ACS Nano 2012, 6, 2992.
[4] S. Wang, P. K. Ang, Z. Wang, A. L. L. Tang, J. T. L. Thong, K. P. Loh, Nano Lett. 2010, 10, 92.
[5] K-Y. Shin, J-Y Hong, J. Jang, Chem. Comm. 2011, 47, 8527.
[6] K-Y. Shin, J-Y Hong, J. Jang, Adv. Mater. 2011, 23, 2113.
[7] L. T. Le, M. H. Ervin, H. Qiu, B. E. Fuchs, W. Y. Lee, Electrochem. Comm. 2011, 13, 355.
[8] V. Dua, S. P. Surwade, S. Ammu, S. R. Agnihotra, S. Jain, K. E. Roberts, S. Park, R. S. Ruoff, S. K. Manohar, Angew Chem. Int. Ed. 2010, 49, 2154.
[9] D. Kong, L. T. Le, Y. Li, J. L. Zunino, W. Lee, Langmuir 2012, 28, 13467.
[10] E. B. Secor, P. L. Prabhumirashi, K. Puntambekar, M. L. Geier, M. C. Hersam, J. Phys. Chem. Lett. 2013, 4, 1347.
[11] E. B. Secor, B. Y. Ahn, T. Z. Gao, J. A. Lewis, M. C. Hersam, Adv. Mater. 2015, 27, 6683.
[12] A. Chou, T. Wicking, N. K. Singh, J. J. Gooding, Chem. Comm. 2005(7), 842-844.
[13] T. J. Davies, R. R. Moore, C. E. Banks, R. G. Compton, J Electroanal. Chem. 2004, 574, 123.
[14] S. Park, R. S. Ruoff, Nat. nanotechnol. 2009, 4, 217.
[15] J. Premkumar, S. B. Khoo, J Electroanal. Chem. 2005, 576, 105.
[16] L. Tang, Y. Wang, Y. Li, H. Feng, J. Lu, J. Li, Adv. Funct. Mater. 2009, 19, 2782.
[17] P. Yasaei, B. Kumar, R. Hantehzadeh, M. Kayyalha, A. Baskin, N. Repnin, C. Wang, R. F. Klie, Y. P. Chen, P. Kral, A. Salehi-Khojin, Nat. Comm. 2014, 5, Article number: 4911
[18] Z-H Sheng, X-Q Zheng, J-Y Xu, W-J Bao, F-B Wang, X-H. Xia, Biosensors Bioelectron. 2012, 34, 125.
[19] Y. Wang, Y. Shao, D. W. Matson, J. Li, Y. Lin, ACS Nano 2010, 4, 1790.
[20] J. C. Claussen, A. Kumar, D. B. Jaroch, M. H. Khawaja, A. B. Hibbard, D. M. Porterfield, T. S. Fisher, Adv. Funct. Mater. 2012, 22, 3399.
[21] C. Xu, X. Wang, J. Zhu, J Phys. Chem. C 2008, 112, 19841.
[22] X. Li, Y. Zhu, W. Cai, M. Borysiak, B. Han, D. Chen, R. D. Piner, L. Colombo, R. S. Ruoff, Nano Lett. 2009, 9, 4359.
[23] M. F. El-Kady, V. Strong, S. Dubin, R. B. Kaner, Science 2012, 1326.
[24] W. Gao, N. Singh, L. Song, Z. Liu, A. L. M. Reddy, L. Ci, R. Vajtai, Q. Zhang, B. Wei, P. M. Ajayan, Nat. Nanotechnol. 2011, 6, 496.
[26] A. C. Ferrari, J. C. Meyer, V. Scardaci, C. Casiraghi, M. Lazzeri, F. Mauri, S. Piscanec, D. Jiang, K. S. Novoselov, S. Roth, A. K. Geim, Phys. Rev. Lett. 2006, 97, 187401.
[27] Y. Hernandez, V. Nicolosi, M. Lotya, F. M. Blighe, Z. Sun, S. De, I. T. McGovern, B. Holland, M. Byrne, Y. K. Gunko, J. J. Boland, P. Niraj, G. Duesberg, S. Krishnamurthy, R. Goodhue, J. Hutchison, V. Scardaci, A. C. Ferrari, J. N. Coleman, Nat. Nanotechnol. 2008, 3, 563.
[28] S. Bae, H. Kim, Y. Lee, X. Xu, J-S. Park, Y. Zheng, J. Balakrishnan, T. Lei, H. R. Kim, Y. I. Song, Y-J. Kim, K. S. Kim, B. Ozyilmaz, J-H. Ahn, B. H. Hong, S. Iijima, Nat. Nanotechnol. 2010, 5, 574.
[29] A. J. Bard, L. R. Faulkner, Electrochemical methods: fundamentals and applications, vol. 2. Wiley New York, 1980.
[30] K. M. Marr, B. Chen, E. J. Mootz, J. Geder, M. Pruessner, B. J. Melde, R. R. Vanfleet, I. L. Medintz, B. D. Iverson, J. C. Claussen, ACS Nano 2015, 9, 7791.
[31] A. J. Bandodkar, I. Jeerapan, J.-M. You, R. Nunez-Flores, J. Wang, Nano Lett., 2016, 16, 721.
[32] A. J. Bandodkar, V. Mohan, C. S. Lopez, J. Ramirez, J. Wang, Adv. Electron. Mater., 2015, DOI: 10.1002/aelm.201500289
[33] A. J. Bandodkar, R. Nunez-Flores, W. Jia, and J. Wang, Adv. Mater. 2015, 27, 3060.
[34] S. J. Stuart, A. B. Tutein, J. A. Harrison, J Chem. Phys. 2000, 112, 6472.
[35] A. M. Popov, I. V. Lebedeva, A. A. Knizhnik, Y. E. Lozovik, B. V. Potapkin, Chem. Phys. Lett. 2012, 536, 82.
[36] W. Shinoda, M. Shiga, M. Mikami, Phys. Rev B 2004, 69, 134103.

Supporting Information

Tunable 3D Nano-Structured Inkjet Printed Graphene Via UV Pulsed-Laser Irradiation for Electrochemical Sensing Supplemental Figures & Tables FIG. 5A illustrates the following: From Left to Right: (left) snapshots of graphene inkjet printed on $n^{++}$-Si/SiO$_2$ (300 nm) wafer, (middle) Kodak® cellulose photo paper, and (right) Kapton® polyimide foil. All substrates (except cellulose paper, which was simply dried with a nitrogen gun) were cleaned with acetone and methanol and subsequently dried with nitrogen gas prior to printing. Initial inkjet printing tests were performed on silicon to verify the printer settings and ink viscosity requirements necessary for inkjet printing graphene. The experiments performed in this work were conducted with graphene inkjet printed on flexible substrates, viz. cellulose and polyimide.

Figure 5B:
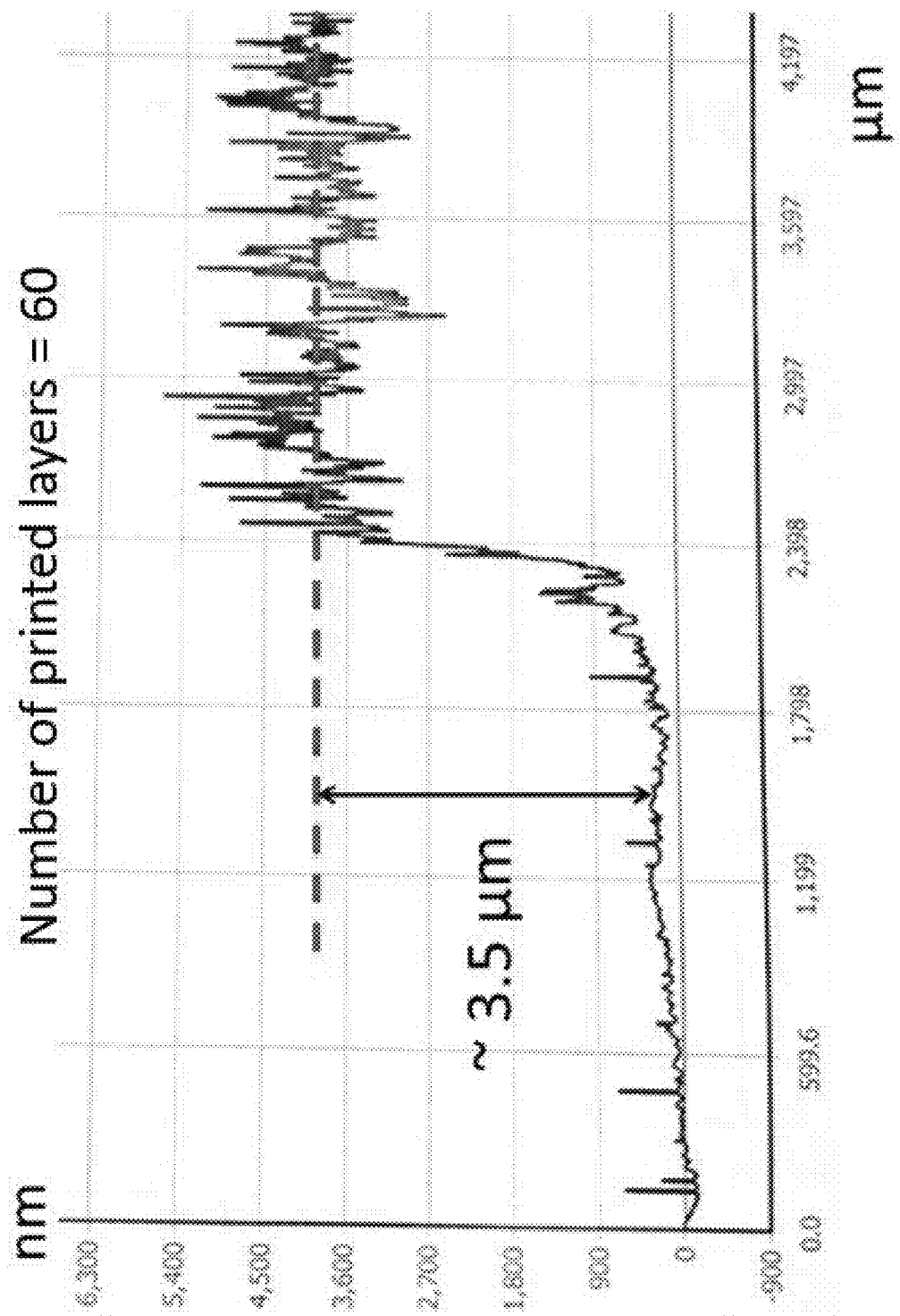
FIG. 5B is a graph related to the possibility of different thicknesses for the printed pattern with ink jet printing.

FIG. 5B illustrates the following: Profilometer thickness measurement of a graphene electrode inkjet printed on a polyimide substrate. The graphene electrode was created with 60 printing passes and was subsequently laser annealed with a power density of 85 mJ cm$^{-2}$. The thickness measurement is noticeably rough—a characteristic that is consistent with the development of petal-like graphene petals (see FESEM images of the graphene electrodes annealed with a laser power density of 85 mJ cm$^{-2}$: FIG. 5D).

Figure 5C:
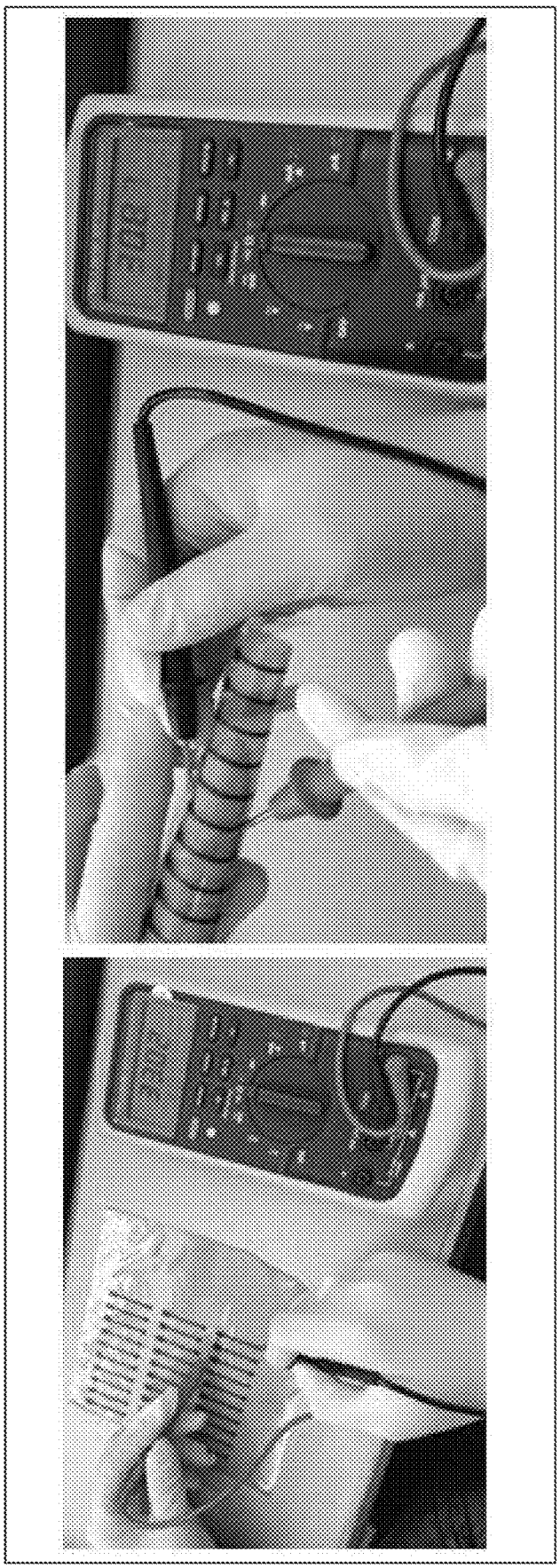
FIG. 5C are additional photos of ink jet printed electrodes according to aspects of the present invention, printed on a flexible substrate and showing bending of the substrate does not materially affect electrical properties of the electrodes.
Figure 5D:
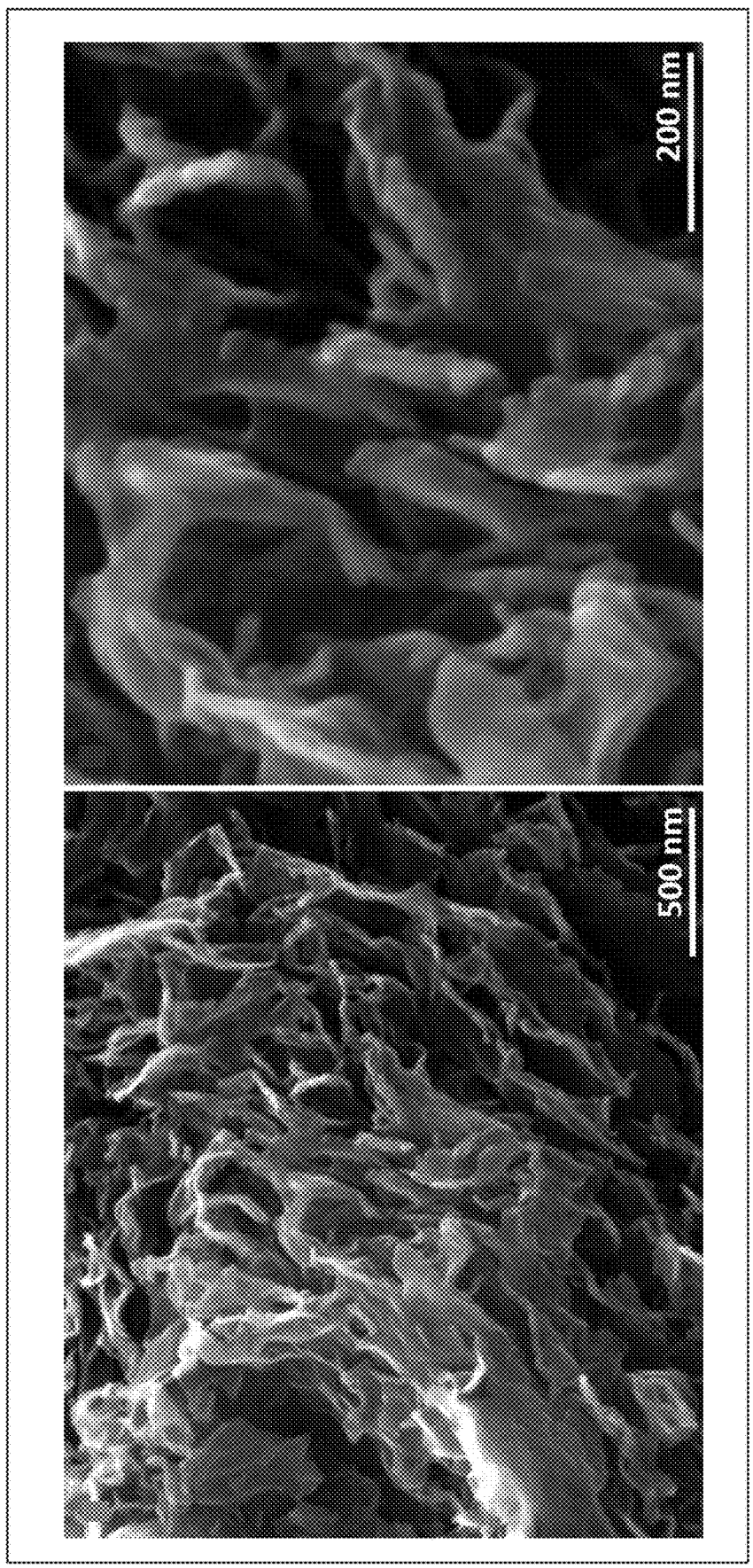
FIG. 5D are greatly enlarged images of 3D petal morphology after annealing according to the present invention.

FIG. 5C illustrates the following: Mechanical bending test of a representative array of graphene electrodes printed on a polyimide sheet with 60 printing passes and a subsequent laser annealing with 40 mJ cm$^{-2}$ energy density. The resistances in both the straight and bent states are almost identical with no apparent physical cracking of the printed graphene. The results show stable electrical conductivity even after multiple bending tests, indicating the potential suitability of these printed graphene electrodes in a wide variety of applications were flexibility is paramount.

FIG. 5D illustrates the following: High resolution FESEM images of inkjet printed graphene on polyimide substrate (same region with 2 different magnifications are shown). The graphene electrode was printed with 60 print passes and laser annealed with a power density of 85 mJ cm$^{-2}$. Vertical arrays of petal-like graphene with widths of 20 nm to 50 nm are visible.

Figure 5E:
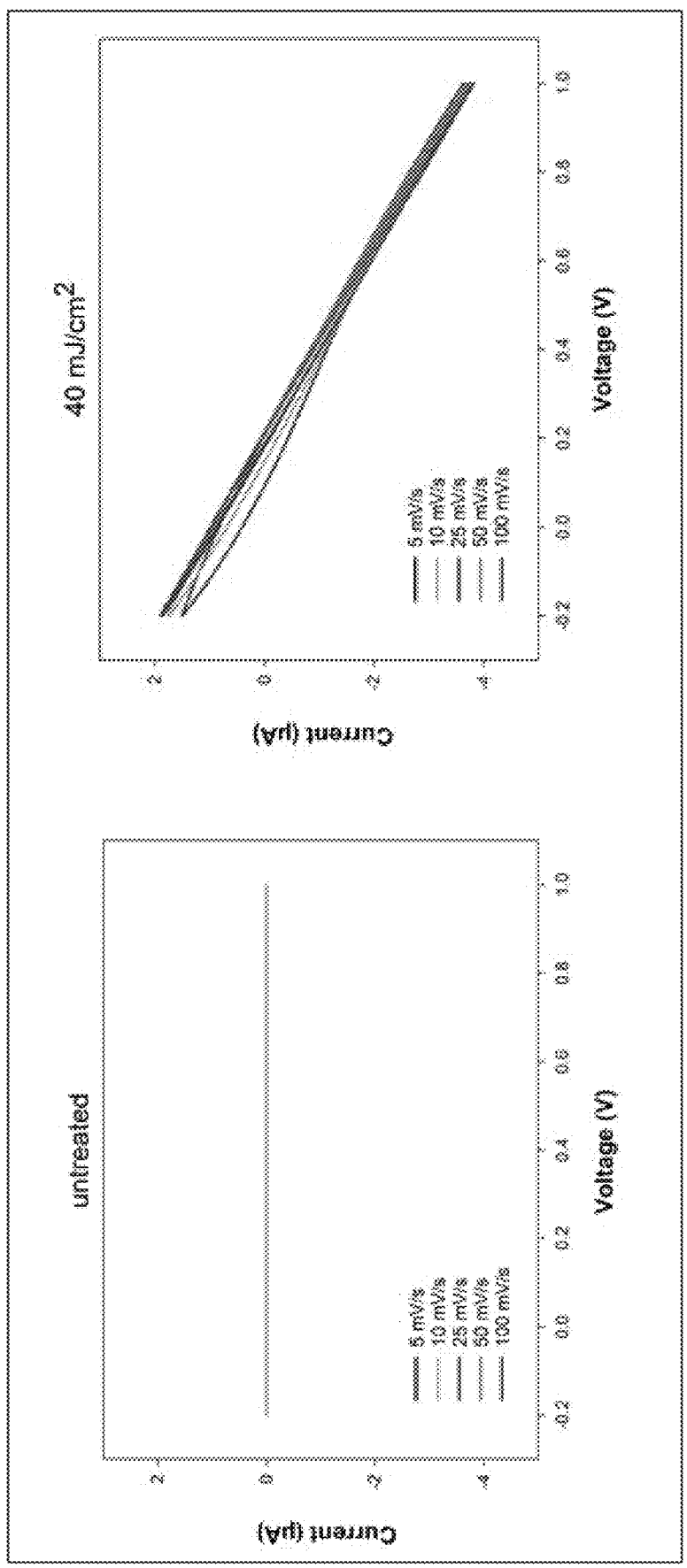
FIG. 5E are graphs showing performance comparison of a printed pattern as an electrochemical sensor between no-annealing and annealing with 40 mJ/cm$^2$ laser energy according to the present invention. The five distinct graphs in FIG. 5E (Graph "a") show no electrochemical response and therefore the graph lines are all overlapping each other and cannot be distinguished, whereas Graph "b" shows results after annealing where the graph lines are similar but distinguishable.

FIG. 5E illustrates the following: Cyclic voltammograms (CVs) of the inkjet printed graphene electrodes (a) without laser annealing, and (b) with laser annealing with a laser power density of 40 mJ cm$^{-2}$. The unannealed electrode (a) displays no change in the current with the sweeping of electrode voltage in the cyclic voltammetry experiment—indicating that unannealed printed graphene is too resistive for electrochemical sensing. The laser annealed printed graphene electrode displayed a very broad and relatively small redox peak at the lowest scan rate (5 mV/sec). This CV indicates that even at low power densities, the laser annealing process can begin to transform the printed graphene into an electroactive surface. The five distinct graphs in FIG. 5E at graph "a" show no electrochemical response and therefore the graphs are all overlapping each other.

TABLE S1

Comparison table of photon-based annealing techniques and the presented laser annealing technique for graphene-based surfaces.

| | Continuous/ Pulsed photon | Wavelength exposure | Energy density | Power | Supplementary Reference # |
|---|---|---|---|---|---|
| Reduced graphene oxide | Continuous infrared laser (in DVD drive) | 788 nm | — | 5 mW | S1 |
| Reduced graphene oxide | X-660 Laser Cutter platform (CO$_2$ laser) | 10.6 μm | — | 2.4 W | S2 |
| Reduced graphene oxide | Continuous wave laser | 532 nm | — | 500 mW | S3 |
| Inkjet-printed Graphene | Xenon Sinteron 2000 (pulsed) | 240-1500 nm broad | 25 J/cm$^2$ maximum | 25 kW maximum | S4 |
| Reduced graphene oxide | Yb-doped Potassium Gadolinium Tungstate laser (pulsed) | 1030 nm | 50 mJ/ cm$^2$ | ~3 E11 W | S6 |
| Inkjet-printed reduced graphene oxide | Pulsed laser (Nd:Yag) | 355 nm (3$^{rd}$ harmonic) | 40 mJ/ cm$^2$ | ~2.7 MW | This work |
| Inkjet-printed reduced graphene oxide | Pulsed laser (Nd:Yag) | 355 nm (3$^{rd}$ harmonic) | 55 mJ/ cm$^2$ | ~4 MW | This work |
| Inkjet-printed reduced graphene oxide | Pulsed laser (Nd:Yag) | 355 nm (3$^{rd}$ harmonic) | 70 mJ/ cm$^2$ | ~5 MW | This work |
| Inkjet-printed reduced graphene oxide | Pulsed laser (Nd:Yag) | 355 nm (3$^{rd}$ harmonic) | 85 mJ/ cm$^2$ | ~5.7 MW | This work |

2. References

[S1] M. F. El-Kady, V. Strong, S. Dubin, R. B. Kaner, Science 2012, 335, 1326.
[S2] W. Gao, N. Singh, L. Song, Z. Liu, A. L. M. Reddy, L. Ci, R. Vajtai, Q. Zhang, B. Wei, P. M. Ajayan, Nat. Nanotechnol. 2011, 6, 496.
[S3] S. K. Del, R. Bornemann, A. Bablich, H. S-Eberwein, J. Li, T. Kowald, M. Ostling, P. H. Bolivar, M. C. Lemme, 2D Materials 2015, 2, 011003.
[S4] E. B. Secor, B. Y. Ahn, T. Z. Gao, J. A. Lewis, M. C. Hersam, Adv. Mater. 2015, 27, 6683.
[S5] A. Stukowski, *Modelling Simul. Mater. Sci. Eng.* 2010, 18, 015012.
[S6] Viskadouros, G., et al., *Appl. Phys. Lett.* 2014, 105, 203104.

E. Specific Example 2

Another exemplary embodiment according to the present invention is described below. It will be appreciated that the basic apparatus or system and operation described with respect to EXAMPLE 1 above can be used in an analogous way for the following results.

Figure 6A:
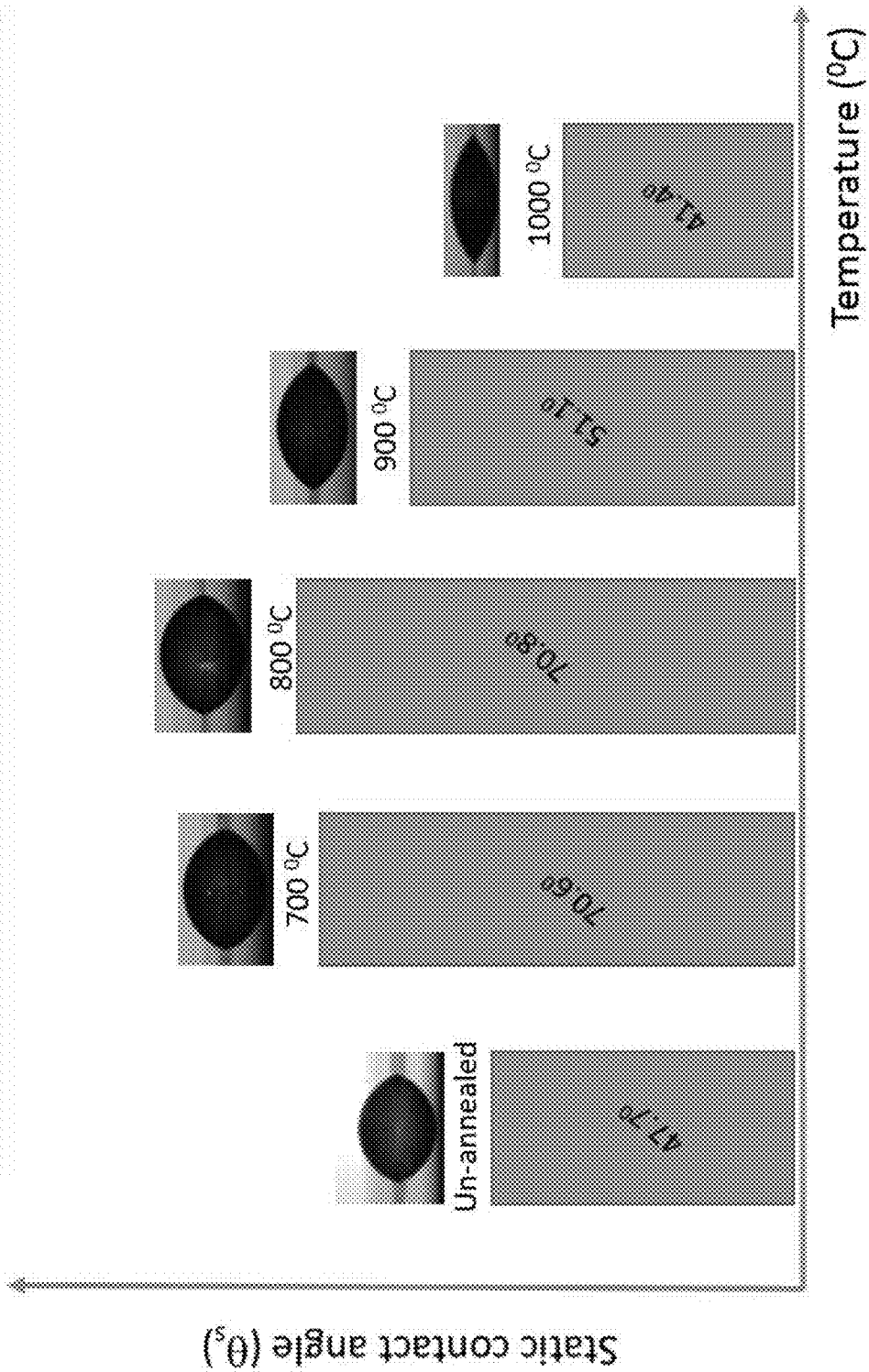
FIG. 6A is a graph and diagrams illustrating level of hydrophobicity of an inkjet printed electrode such as FIG. 1B, either before any post-printing annealing and at different conventional post-printing thermal annealing temperatures.
Figure 6B:
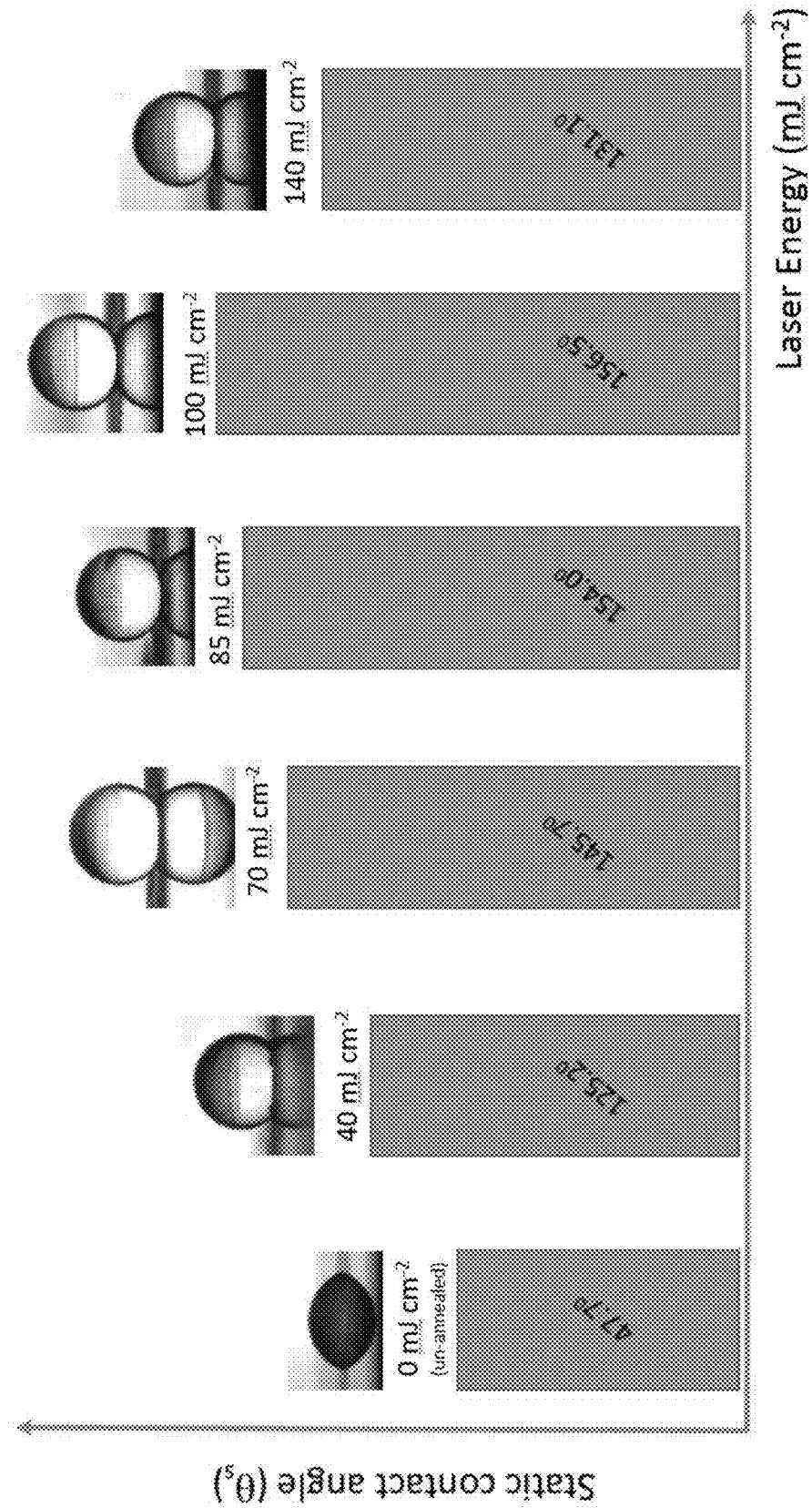
FIG. 6B is a graph and diagrams of a method according to another exemplary embodiment of the invention, illustrating how hydrophobicity of the inkjet printed electrode of FIG. 6A can be increased to different levels by tuning the laser energy of a pulsed laser in post-printing processing.

FIGS. 6A and 6B show results from static water angle experiments that are used to determine the hydrophobicity of a surface. In general terms, a water contact of 150° or greater is superhydrophobic, 90° to 150° is hydrophobic, and below 90° is considered hydrophilic.

The first slide (FIG. 6A) is a graph that shows that conventional thermal annealing [(putting the printed graphene samples in a furnace filled with an inert gas (e.g., nitrogen)]. Conventional thermal annealing cannot transform the surface into one that is hydrophobic nor one that is superhydrophobic. We show for the first time that a laser can be used to make a graphene surface hydrophobic and even superhydrophobic. The power density of the laser can be tuned or dialed in to change the level of hydrophobicity of the surface according to the needs of the application (see FIG. 6B).

The superhydrophobic graphene is permanent. The superhydrophobicity would not "wash-off" as polymer coating that induce superhydrophobicity can. Therefore, this superhydrophobic graphene could be incorporated into aircraft parts to prevent icing, car parts for self-cleaning of mud, wind turbine blades to for self-cleaning of bugs/birds, or solar cells to prevent water from pooling on the surface (Note: graphene at a few layers thick is relatively optically transparent so these materials could act as a permanent transparent coating).

An example of a self-cleaning car from Nissan can be found at www.geek.com/news/nissan-adds-superhydrophobic-coating-their-cars-1592251/. Note the self-cleaning polymer has to be reapplied as the polymer wears off. Our graphene layer would be incorporated directly into the part and would be mechanically etched with a laser. The graphene nor its hydrophobicity would not wear off and would be permanent.

Additional description, and supporting materials, follow regarding this example.

Example 2 Additional Information

Wetting Opacity of Electrically Conductive and Mechanically Flexible 3D Nanostructured Graphene Ultralow surface wettability in nature, such as in lotus leaves and butterfly wings,[1-2] has inspired biomimetic, microscale patterned designs using a variety of materials[2-4]. Hydrophobicity fundamentally originates from the surface energy between the molecular interactions of surface and liquid molecules. Herein we elucidate the link between hydrophobicity and nanoscale patterning by geometrically orienting nanoscale graphene flakes, which is achieved by direct pulsed laser writing of inkjet-printed graphene. The resulting 3D nanostructured graphene surface has arrays of petal-like microstructures, that result in 'wetting opacity' where the superhydrophobicity of the graphene is determined by its physical structure rather than the underlying substrate properties. This is in contrast to studies on hydrophilic single/few-layer graphene that show transparent wettability[5]. Both inkjet-printing and laser writing are scalable processes that can be conducted on fragile or flexible materials, making the resulting graphene well-suited for applications that require electrical conductivity, self-cleaning, and reduced drag capabilities[6-9], such as those needed for wearable electronics.

Studies on the hexagonal honeycomb carbon lattice in single/few layer graphene have shown that these surfaces display hydrophilic or hydrophobic properties depending on the material composition of the underlying substrate or adsorption of hydrocarbons and epoxide groups to graphene[5, 32-33]. Single layer graphene creates a surface that displays 'wetting transparency' where water molecules do not effectively 'see' graphene and instead behave in accordance with the contact angle (CA) of the underlying substrate. In contrast, multilayer graphene, at least four atomic layers thick, impedes wetting transparency and graphene hydrophobicity depends primarily upon superficial hydrocarbon and epoxide groups[32,34]. This letter is focused on manipulating the physical structure of the graphene itself to induce intrinsic hydrophobicity without hydrophobe/hydrophil reflection or chemical modification. Such 'wetting opacity', as we shall call it, can be manipulated via rapid-pulse laser processing of printed graphene flakes.

Recently, laser processing has been used to create corrugated micron thick multilayer graphene with a high degree of surface defects that is well suited for sensing and energy storage applications.[24,35-38] However, a multifunctional platform demonstrating electrical sheet conductance with mechanical flexibility and tunable surface wettability has not been previously demonstrated. Here, we show the design of a 3D nanostructured inkjet-printed graphene (IPG) surface, that is electrically conductive, mechanically robust, and opaque to wetting (i.e., superhydrophobic where) after laser processing. Inkjet-printing graphene allows for a scalable approach, while direct-pulsed laser writing (DPLW) induces superhydrophobicity with tunable electrical conductivity of the printed graphene. Using molecular dynamics (MD) and contact goniometry, we reveal that the nanoscale ordering of vertically oriented multilayer graphene is responsible for tuning the hydrophobicity of the graphene.

Figure 7A:
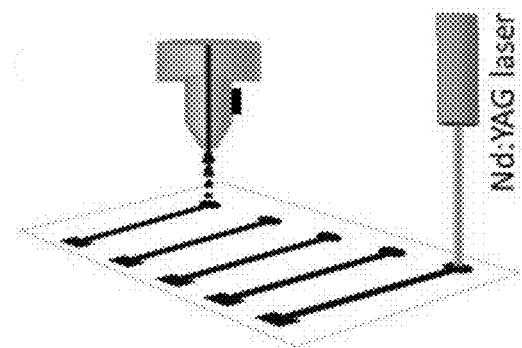
FIGS. 7A-G are illustrations according to Specific Example 2 relating to hydrophobicity.
Figure 7B:
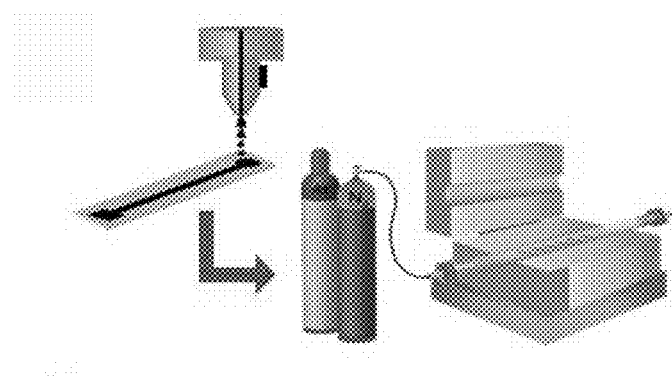
Figure 7C:
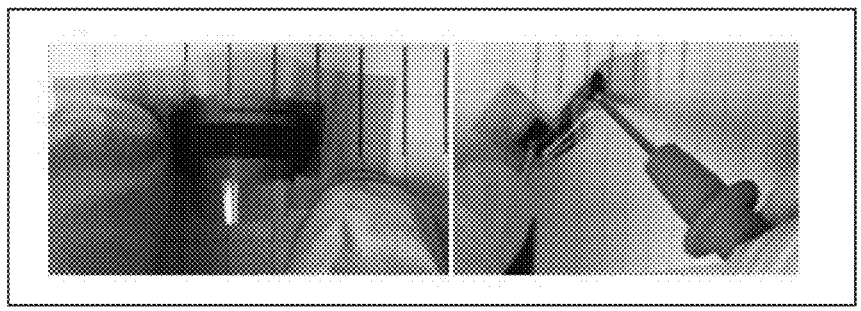
Figure 7D:
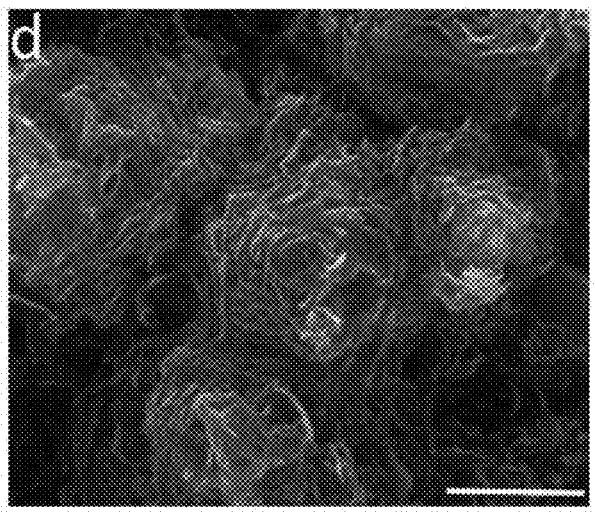
Figure 7E:
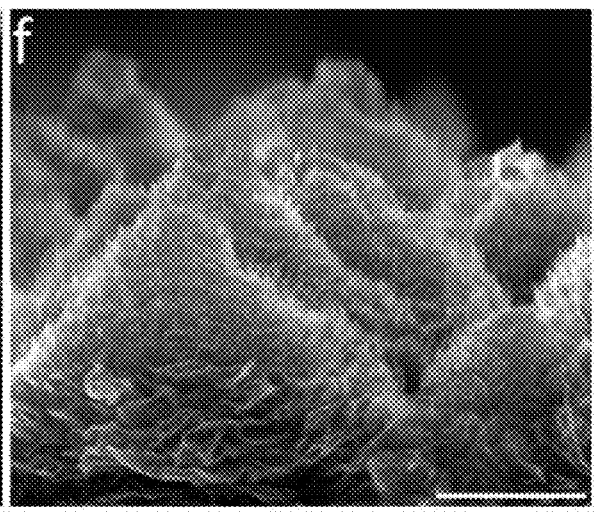
Figure 7F:
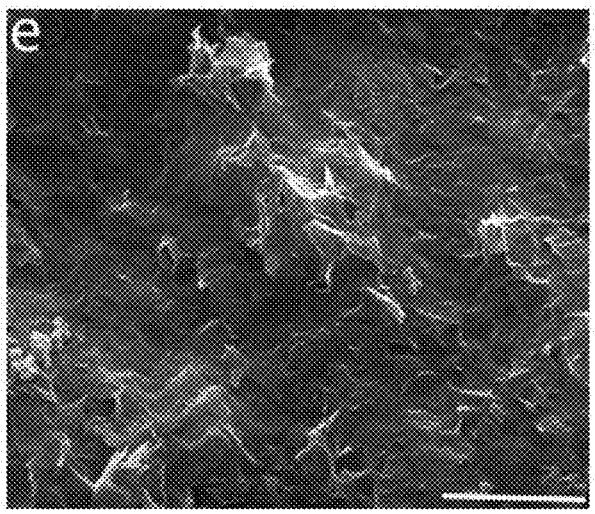
Figure 7G:
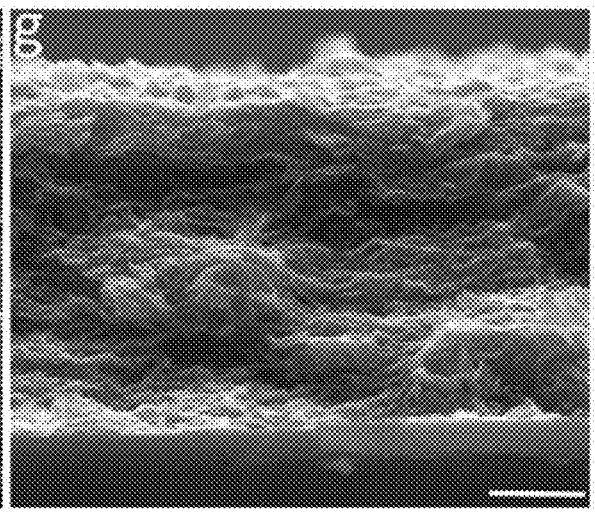

IPG was developed with a thickness of ~7 μm in thickness and post-processed via both DPLW and conventional thermal annealing (FIG. 7a & b). DPLW processing was conducted with increasing energy density (40, 70, 85, 100, and 120 mJ cm$^{-2}$ respectively). Thermal annealing was conducted with annealing temperatures between 700-1000° C. within a forming gas ambient. The results indicate that DPLW processing of graphene generates 3D nanostructures with features of two characteristic length scales: a local fin-like nanoscale structure (FIG. 7d), as well as a micronscale rose-petal structure (FIG. 7f). In contrast, thermal annealing revealed a comparatively smooth surface (FIG. 7e & g).

FIG. 7 is: (a) Schematic diagram and field emission scanning electron microscopy (FESEM) images showing the inkjet printing of reduced graphene oxide and (b) the subsequent DPLW or thermal annealing processing. (c) The IPG on polyimide withstands mechanical bending and twisting. (d) Top view of the printed graphene surface after DPLW processing at an energy density of 100 mJ cm$^{-2}$ (e) Top view of graphene after thermal annealing at a temperature of 900° C. (f) Cross-sectional view of the DPLW processed graphene. (g) Cross-sectional view of thermally annealed graphene. All scale bars are 2 μm.

Figure 8A:
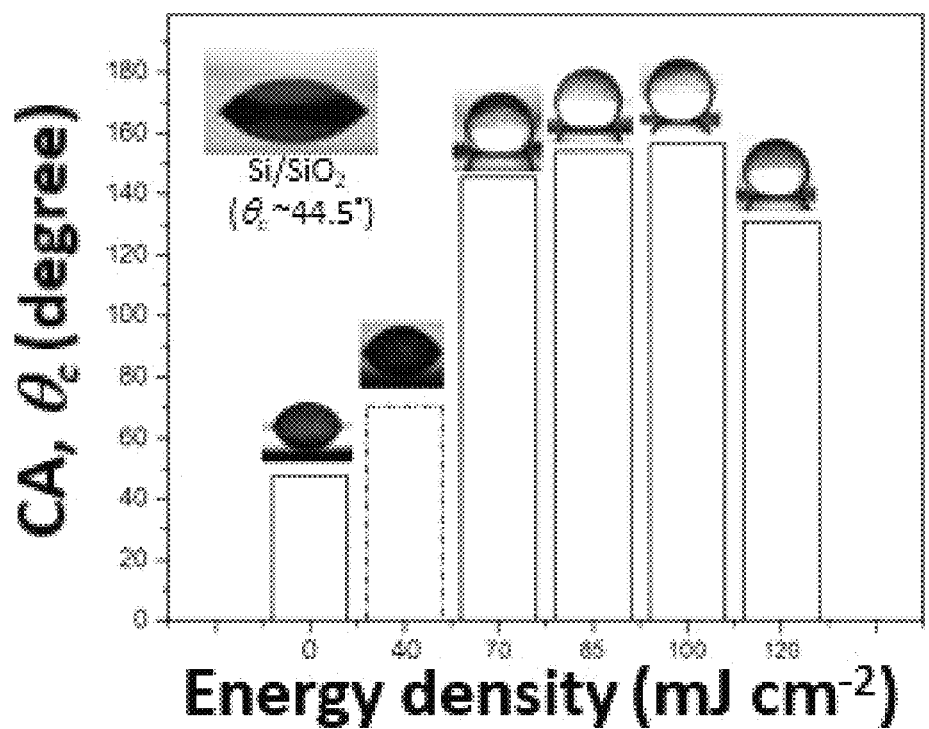
FIGS. 8A-F are images and graphs showing hydrophobicity according to Specific Example 2.
Figure 8B:
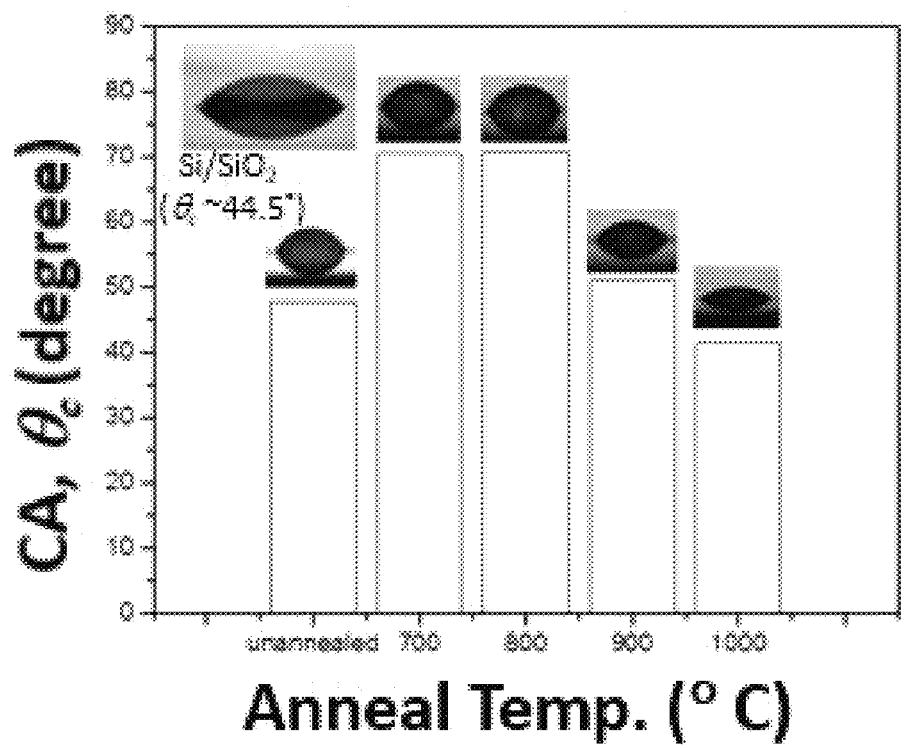
Figure 8C:
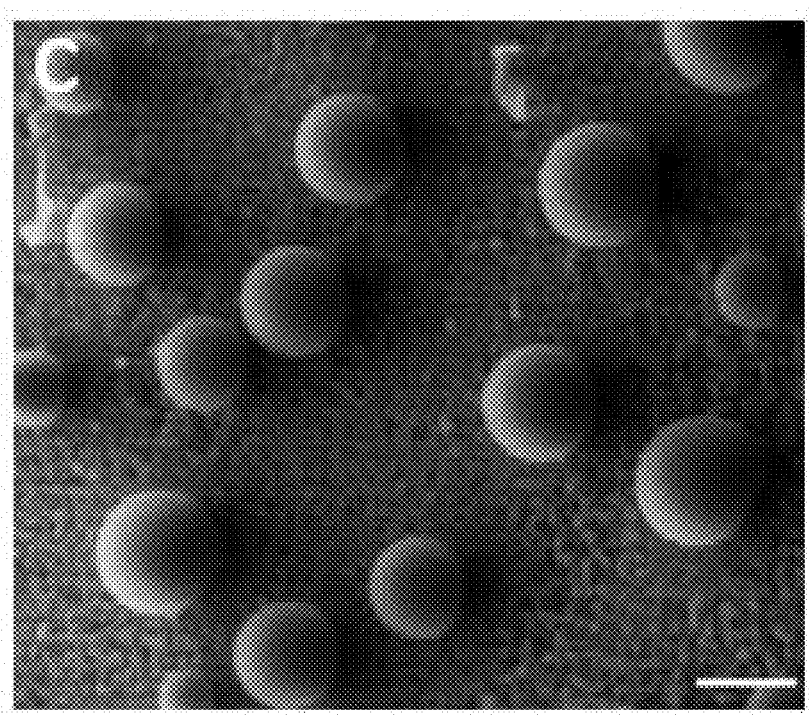
Figure 8D:
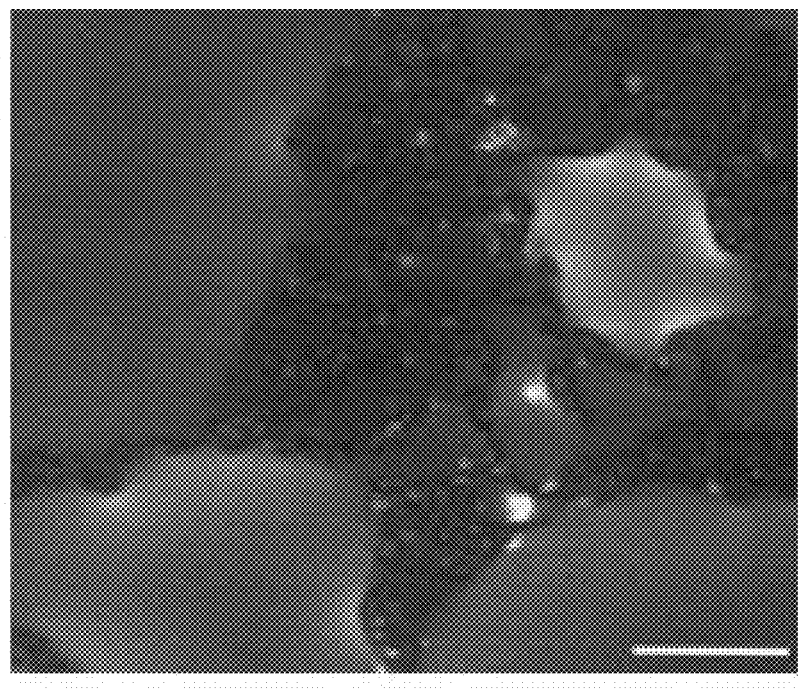
Figure 8E:
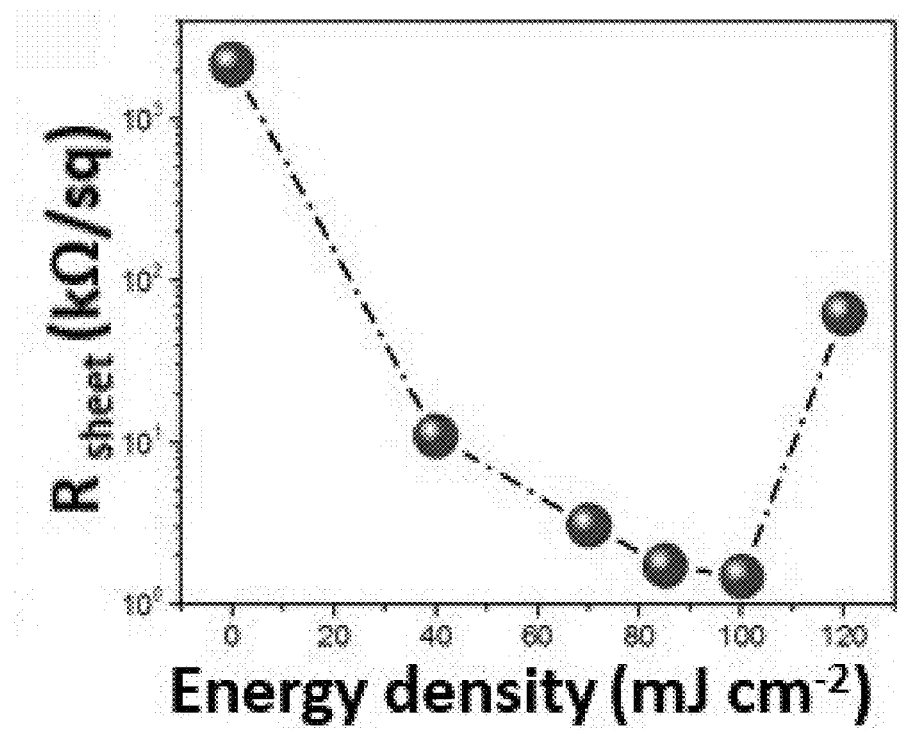
Figure 8F:
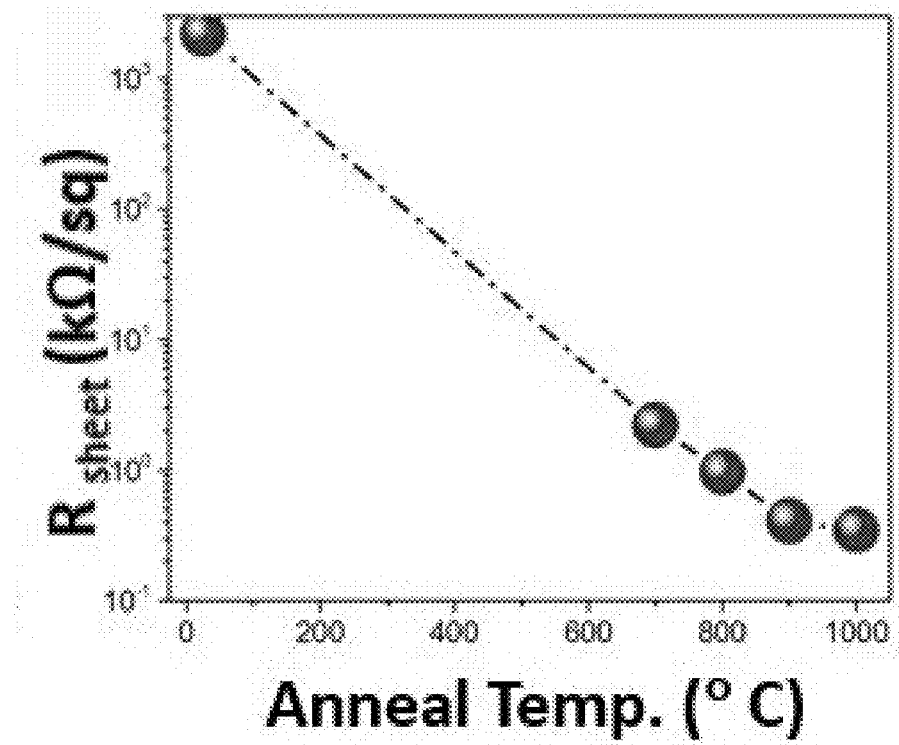

The hydrophobicity and electrical conductivity of the IPG was significantly altered/improved by DPLW and thermal annealing processes. Droplets of deionized water (3-6 μL, resistivity ~18.3 MΩ–cm) were dispensed in several locations onto the surface, and the static water contact angle (WCA) of both DPLW and thermally treated graphene were measured via contact goniometry (FIGS. 8a & b and Supplementary Information). DPLW treated graphene displayed a sharp increase in the WCA with the lowest fluence setting (125.2°, 40 mJ×cm$^{-2}$) as compared to the control samples, Si/SiO$_2$ with ~30 0 nm oxide and IPG without laser or thermal annealing displayed WCAs of 44.5° and ~47.7°, respectively. The control value was found to be consistent with that previously reported for GO[40] as well as with films with oxygen functional groups[35]. DPLW operated at laser energy density within the range of 85-100 mJ cm$^{-2}$ transformed the surface into one that is superhydrophobic (i.e., WCA>150°). However, the IPG WCA decreased)(~138° when laser fluence was increased to 120 mJ×cm$^{-2}$, an attribute that is most likely due to electrode degradation. The IPG that was thermally annealed was unable to induce superhydrophobicity (maximum measured WCA was 70.8°) across annealing temperatures of 800-1000° C. (FIG. 8b). The WCAs for the thermally annealed IPG are approximately 20° smaller than those obtained for multilayer (>6 layers) and flat graphene[5], but similar in magnitude to those reported for chemically synthesized reduced GO films.[41] The WCA of thermally annealed graphene begin to diminish at higher temperatures where WCA values where 51.1° and 41.4° at annealing temperatures of 900° C. and 1000° C. respectively. This decrease in WCA at high annealing temperatures is most likely due to the smoothening of the graphene surface at higher high temperatures. In a similar fashion, the electrical conductivity of the distinctly annealed IPG samples changed with increasing laser energy density or annealing temperature (FIGS. 8e & 8f). The electrical sheet resistance of the IPG samples decreased by more than three orders of magnitude from XX MΩ/□ to XX kΩ/□ as DPLW energy density increased to 100 mJ×cm$^{-2}$ (FIG. 8e). It is interesting to note that 100 mJ×cm$^{-2}$ is the same laser energy density that maximizes both the superhydrophobicity and the electrical conductivity of the IPG. ensuring the scalability of laser annealed IPG for electronics and self-cleaning applications. Likewise, electrical sheet resistance of the IPG samples decreased by more than three orders of magnitude from XX MΩ/□ to XX kΩ/□ as the thermally annealing temperature was increased to 1000° C. (FIG. 8f).

FIG. 8 is: Comparison of WCA, condensation, and electrical sheet resistance of IPG that was DPLW annealed (a, c, e) or thermally annealed (b, d, f). (a) WCAs for IPG electrodes treated with DPLW at distinct laser energy densities. Inset shows the WCA of a control Si/SiO$_2$ surface without IPG. (b) WCAs measured on IPG that were thermally annealed at distinct temperatures. Water condensation experiments performed on (c) laser annealed (100 mJ/cm$^2$) and (d) thermally annealed (800° C.) IPG inside an environmental SEM chamber. Scale bars correspond to 50 μm. Larger spherical droplets indicate water condensation and small bright spots (red arrows) indicate initial water droplet formation. Electrical conductivity experiments display sheet resistance vs. (e) laser energy density and (f) temperature for laser and thermally annealed IPG respectively.

The surface wettability of the superhydrophobic DPLW treated (100 mJ cm$^{-2}$) and hydrophilic thermally annealed (800° C.) IPG were characterized via environmental scanning electron microscopy (ESEM) (FIGS. 8c & 8d). Distinctly shaped, spherical water droplets (dia. <5-50 μm) formed upon the DPLW treated IPG during ESEM imaging (FIG. 8c). These water droplets repeatedly appeared and vanished as the temperature and environmental water vapor pressure were altered within the ESEM (see Supplementary Video #). Water droplet formation was noticeably absent from the thermally annealed IPG during ESEM experiments (FIG. 8d)—thus further corroborating the hydrophobic and hydrophilic nature of the DPLW and thermally annealed IPG respectively. While several other studies have demonstrated that graphene can become hydrophobic as a result of organic polymer encapsulation the only possible contamination on these surfaces would originate from airborne hydrocarbon or epoxide adsorption[34,39], as the graphene used throughout was not doped with any additional materials except those stated. Additionally, the values for the WCAs of GO and few layer graphene are a result of the material properties as and do not result in wetting transparency, as thicknesses greater than 30 nm are not subjected to this phenomena[5].

Figure 10A:
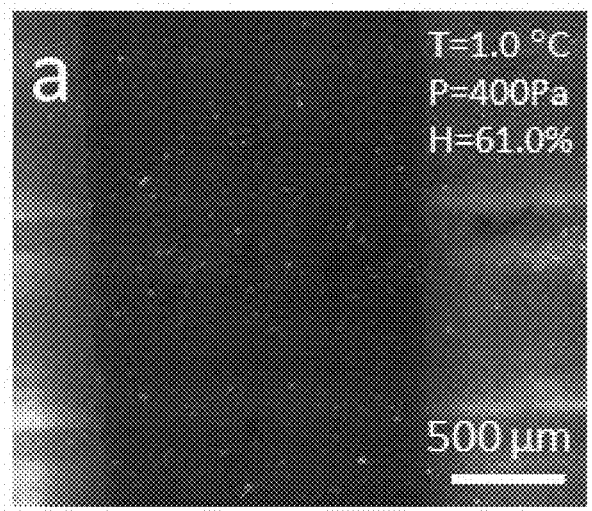
FIGS. 10A-G are greatly magnified images according to Specific Example 2.
Figure 10B:
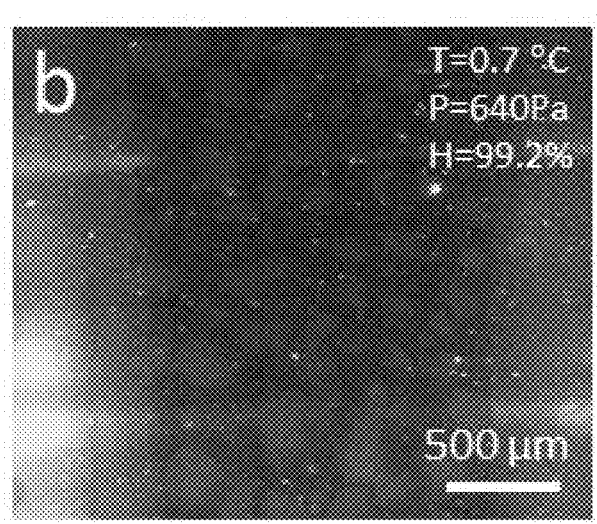
Figure 10C:
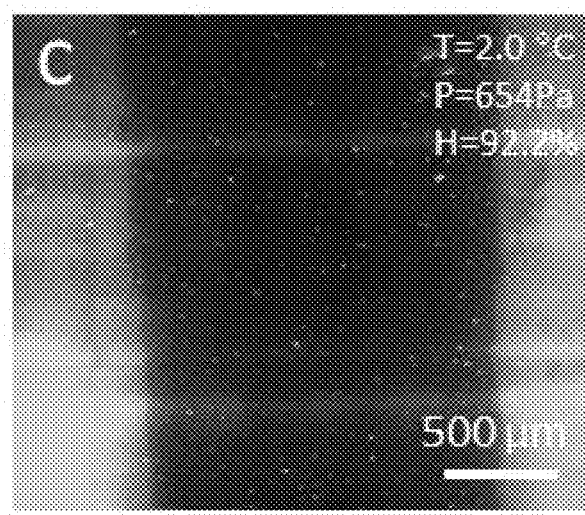
Figure 10D:
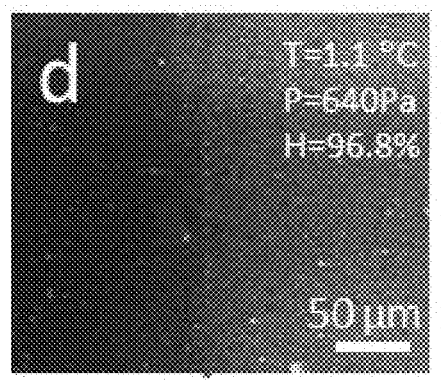
Figure 10E:
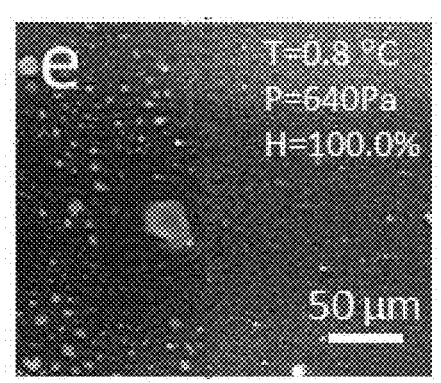
Figure 10F:
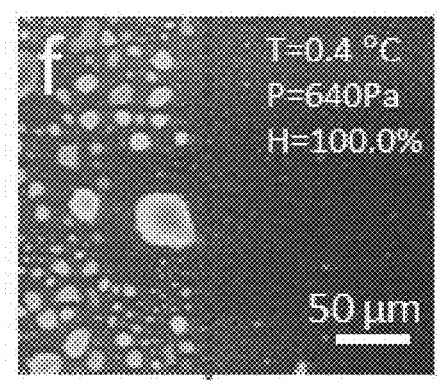
Figure 10G:
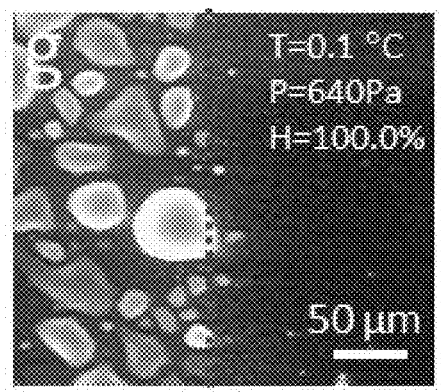

Finally, we present the utility of using DPLW to selectively pattern distinct superhydrophobic regions on a signal IPG surface to form hydrophilic channels for potential fluid transport in an "open microfluidic" paradigm. Such open fluid transport permits fluid droplet transport on top of substrates via the differential pressure across the droplet interface (i.e. Laplace pressure) within hydrophilic tracks delimited by hydrophobic regions. Such hydrophilic tracks were created in the IPG via superhydropholic demarcations created with the DPLW process (100 mJ×cm$^{-2}$) (FIG. 10). The wetting properties of these tracks were analyzed within a FEI FESEM where the chamber pressure, chamber humidity, and were altered in a controlled fashion (FIG. 10a-c). Initial water droplet formation could be noticeable observed on the hydrophilic tracks when the chamber humidity was set to more than 99% and the pressure at 640 Pa. (FIG. 10b). Next, the gradual wetting of the channel with larger water droplet formation occurred as the temperature was reduced was reduced from 1.1° C. to 0.1° C.

FIG. 10 is: FESEM images of a graphene hydrophilic/super-hydrophobic channel formed using laser patterning and water droplet manipulation in the design. The width of the hydrophilic channel (darker region in FIG. 10(a)) confined by two super-hydrophobic strips on both of its sides is ~1.5 mm. The water condensation experiment was performed by changing the temperature of sample stage inside the SEM chamber as well as the chamber's pressure and humidity. (a)-(c) A chamber pressure of around 640 Pa and humidity more than 99% are ideal conditions for water condensation on the hydrophilic graphene surface. (d)-(g) The temperature is found to be very sensitive for water condensation.

In summary, we have demonstrated a simple and scalable manufacturing method to produce large-scale 3D nanostructured graphene surface features that enable multifunctional properties: hydrophobic-superhydrophobic surface tunability, high electrical conductivity, and mechanical flexibility. For the first time, to best of our knowledge, we propose and demonstrate that the hydrophilic-superhydrophobic transition could be achieved solely by manipulating the orientation of printed graphene flakes. These non-wetting graphene surfaces are amenable to a wide range of emerging technologies such as self-cleaning chemical/biological sensors, flexible electronics, and de-icing surfaces. Furthermore the IPG shows promise for the development of open microfluidic surfaces where fluid transport is carried out on the top of hydrophilic tracks delimited by hydrophobic regions. Such open microfluidics constructs typically require sophisticated surface engineering (e.g., UV photomasks or chemical modification with self-assembled monolayers SAM chemistry) and deep reactive ion etching and or nanoparticle air brushing) that significantly increase the time and cost to develop these devices. Therefore, the ability to selectively pattern superhydrophobic areas of hydrophilic IPG presents a potential scalable process for the development of low-cost multiplexed, droplet-based biosensing and chemotaxis studies.

Methods

Inkjet-Printing of Graphene and Post-Printing Processes:
Printable graphene ink, formulated following a recipe reported earlier[35], is loaded into the printer cartridge (10 pL nominal drop volume nozzle) of a Fujifilm Dmatix materials inkjet printer (DMP2800). Graphene writing parameters (such as waveform, temperature, viscosity of ink, drop spacing etc.) are used as optimized before[35] on silicon as well as the polyimide substrates. The thermal annealing is performed (on graphene on silicon/oxide substrates) using a furnace with forming gas flow. Samples were annealed for 1 hour at 700° C., 800° C., 900° C., and 1000° C. The laser irradiation was performed on graphene printed on polyimide surface (25 μm thick) using a Nd:YAG pulsed laser ($3^{rd}$ harmonic at 355 nm and 15 ns pulse width) and the sample is exposed to the laser beam using an x-y translator.

Sheet Resistance Measurements:

A Jandel Multi Height Probe with RM3000 Test unit is used for room temperature four-probe sheet resistance measurements. The measurements were done at five different areas on each sample and the mean value was reported.

Scanning Electron Microscope (SEM) Images:

A Field-Emission Scanning Electron Microscope (FE-SEM) [FEI Quanta 250] is used for capturing the high resolution static images. The same microscope but with environmental operational mode (controlling the temperature and water vapor pressure inside the column) is used for water condensation experiments. Secondary electron (SE) mode with 10 kV accelerating voltage and a working distance of ~10 mm was used to capture the images. Water contact angle measurements: Water drops (DI water, resistivity ~18.3 MΩ cm), each of 3-6 μL volume is placed gently on the surface of the electrodes (kept perfectly horizontally) and the side-view images are captured using a microscope attached to a camera. Later ImageJ software is used to process the CAs from the shape/image of the droplets.

REFERENCES

1. Darmanin, T. & Guittard, F., Superhydrophobic and superoleophobic properties in nature. *Mater Today* 18, 273-285, (2015).
2. Feng, L. et al. Super-hydrophobic surfaces: from natural to artificial. *Adv Mater* 14, 1857-1860, (2002).
3. Fürstner, R., Barthlott, W., Neinhuis, C. & Walzel, P. Wetting and self-cleaning properties of artificial superhydrophobic surfaces. *Langmuir,* 21, 956-961, (2005).
4. Wu, X., Zheng, L. & Wu, D. Fabrication of superhydrophobic surfaces from microstructured ZnO-based surfaces via a wet-chemical route. *Langmuir* 21, 2665-2667, (2005).
5. Rafiee, J. et al. Wetting transparency of graphene. *Nat Mater* 11, 217-222, (2012).
6. Blossey, R. Self-cleaning surfaces—virtual realities. *Nat Mater* 2, 301-306, (2003).
7. Lafuma, A., Quere, D. Superhydrophobic states. *Nat Mater* 2, 457-460, (2003).
8. Miljkovic, N. & Wang, E. N. Condensation heat transfer on superhydrophobic surfaces. *MRS Bulletin* 38, 397-406, (2013).
9. Tian, Y., Su, B. & Jiang, L. Interfacial material system exhibiting superwettability. *Adv Mater* 26, 6872-6897, (2014).
10. Zhang, Q. et al. Hyperbolically patterned 3D graphene metamaterial with negative poisson's ratio and superelasticity. *Adv Mater* 28, 2229-2237, (2016).
11. Hu, H., Zhao, Z., Wan, W., Gogotsi, Y. & Qiu, J. Ultralight and highly compressible graphene aerogels. *Adv Mater* 25, 2219-2223, (2013).
12. Huang, H., Chen, P., Zhang, X., Lu, Y., & Zhan, W. Edge-to-edge assembled graphene oxide aerogels with outstanding mechanical performance and superhigh chemical activity. *Small* 9, 1397-1404, (2013).
13. Qin, Y. et al. Lightweight, superelastic, and mechanically flexible graphene/polyimide nanocomposite foam for strain sensor application. *ACS Nano* 9, 8933-8941, (2015).
14. Qiu, L., Liu, J. Z., Chang, S. L. Y., Wu, Y., Li, D. Biomimetic superelastic graphene-based cellular monoliths. *Nat Commun* 3, 1241, (2012).
15. Sun, H., Xu, Z., Gao, C. Multifunctional, ultra-flyweight, synergistically assembled carbon aerogels. *Adv Mater* 25, 2554-2560, (2013).
16. Wicklein, B. et al. Thermally insulating and fire-retardant lightweight anisotropic foams based on nanocellulose and graphene oxide. *Nat Nano* 10, 277-283, (2015).
17. Xu, X. et al. Self-sensing, ultralight, and conductive 3D graphene/iron oxide aerogel elastomer deformable in a magnetic Field. *ACS Nano* 9, 3969-3977, (2015).
18. Xu, Z., Zhang, Y., Li, P. & Gao, C. Strong, conductive, lightweight, neat graphene aerogel fibers with aligned pores. *ACS Nano* 6, 7103-7113, (2012).
19. Zhang, Q. et al. Mechanically robust honeycomb graphene aerogel multifunctional polymer composites. *Carbon* 93, 659-670, (2015).
20. Xu, Y., Sheng, K., Li, C. & Shi, G. Self-assembled graphene hydrogel via a one-step hydrothermal process. *ACS Nano* 4, 4324-4330, (2010).
21. Peng, Q. et al. Graphene nanoribbon aerogels unzipped from carbon nanotube sponges. *Adv Mater* 26, 3241-3247, (2014).
22. Wu, Y. et al. Three-dimensionally bonded spongy graphene material with super compressive elasticity and near-zero Poisson's ratio. *Nat Commun* 6, 6141, (2015).
23. Chen, Z. et al. Three-dimensional flexible and conductive interconnected graphene networks grown by chemical vapour deposition. *Nat Mater* 10, 424-428, (2011).
24. Shi, X. et al. Femtosecond laser rapid fabrication of large-area rose-like micropatterns on freestanding flexible graphene films. *Sci Rep* 5, 17557, (2015).
25. Xu, Y. et al. Functionalized graphene hydrogel-based high-performance supercapacitors. *Adv Mater* 25, 5779-5784, (2013).
26. Gogotsi, Y. What nano can do for energy storage. *ACS Nano* 8, 5369-5371, (2014).
27. Liu, F., Song, S., Xue, D. & Zhang, H. Folded structured graphene paper for high performance electrode materials. *Adv Mater* 24, 1089-1094, (2012).
28. Xiong, G., Meng, C., Reifenberger, R. G., Irazoqui, P. P. & Fisher, T. S. Graphitic petal electrodes for all-solid-state flexible supercapacitors. *Adv Energy Mater* 4 1300515, (2014).
29. Cao, X. et al. Preparation of novel 3D graphene networks for supercapacitor applications. *Small* 7, 3163-3168, (2011).
30. Chen, R. et al. Co-percolating graphene-wrapped silver nanowire network for high performance, Highly stable, transparent conducting electrodes. *Adv Funct Mater* 23, 5150-5158, (2013).
31. Shao, Y. et al. Graphene based electrochemical sensors and biosensors: a review. *Electroanalysis* 22, 1027-1036, (2010).
32. Shin, Y. J. et al. Surface-energy engineering of graphene. *Langmuir* 26, 3798-3802, (2010).
33. Taherian, F., Marcon, V., van der Vegt, N. F. A. & Leroy, F. What is the contact angle of water on graphene? *Langmuir* 29, 1457-1465, (2013).

34. Li, Z. et al. Effect of airborne contaminants on the wettability of supported graphene and graphite. *Nat Mater* 12, 925-931, (2013).
35. Das, S. R. et al. 3D nanostructured inkjet printed graphene via UV-pulsed laser irradiation enables paper-based electronics and electrochemical devices. *Nanoscale* 8, 15870-15879, (2016).
36. El-Kady, M. F., Strong, V., Dubin, S. & Kaner, R. B. Laser scribing of high-performance and flexible graphene-based electrochemical capacitors. *Science* 335, 1326-1330, (2012).
37. Gao, W. et al. Direct laser writing of micro-supercapacitors on hydrated graphite oxide films. *Nat Nano* 6, 496-500, (2011).
38. Secor, E. B., Prabhumirashi, P. L., Puntambekar, K., Geier, M. L. & Hersam, M. C., Inkjet printing of high conductivity, flexible graphene patterns. *J Phys Chem Lett* 4, 1347-1351, (2013).
39. Shunaev, V. V. & Glukhova, O. E. Topology influence on the process of graphene functionalization by epoxy and hydroxyl groups. *J Phys Chem C*, 120, 4145-4149, (2016).
40. Perrozzi, F. et al. Reduction dependent wetting properties of graphene oxide. *Carbon* 77, 473-480, (2014).
41. Moon, I. K., Lee, J., Ruoff, R. S. & Lee, H. Reduced graphene oxide by chemical graphitization. *Nat Commun* 1, 73, (2010).
42. Bocquet, L. & Lauga, E. A smooth future? *Nat Mater* 10, 334-337, (2011).
43. Berendsen, H. J. C., Grigera, J. R. & Straatsma, T. P. The missing term in effective pair potentials. *J Phys Chem* 91, 6269-6271, (1987).
44. Werder, T., Walther, J. H., Jaffe, R. L., Halicioglu, T. & Koumoutsakos, P. On the water-carbon interaction for use in molecular dynamics simulations of graphite and carbon nanotubes. *J Phys Chem B* 107, 1345-1352, (2003).
45. de Ruijter, M. J., Blake, T. D. & De Coninck, J. Dynamic wetting studied by molecular modeling simulations of droplet spreading. *Langmuir* 15, 7836-7847, (1999).
46. Driskill, J., Vanzo, D., Bratko, D. & Luzar, A. Wetting transparency of graphene in water. *The J Chem Phys* 141, 18C517, (2014).
47. Ingebrigtsen, T. & Toxvaerd, S. Contact angles of lennard-jones liquids and droplets on planar Surfaces. *J Phys Chem C* 111, 8518-8523, (2007).
48. Park, S. H., Carignano, M. A., Nap, R. J. & Szleifer, I. Hydrophobic-induced surface reorganization: molecular dynamics simulations of water nanodroplets on perfluorocarbon self-assembled monolayers. *Soft Matter* 6, 1644-1654, (2010).
49. Leroy, F. & Müller-Plathe, F. Dry-surface simulation method for the determination of the work of adhesion of solid-liquid interfaces. *Langmuir* 31, 8335-8345, (2015).
50. Ondarçuhu, T. et al. Wettability of partially suspended graphene. *Sci Rep* 6, 24237, (2016).
51. Gao, L. & McCarthy, T. J. Wetting 101°. *Langmuir* 25, 14105-14115, (2009).
52. Jorgensen, W. L., Maxwell, D. S. & Tirado-Rives, J. Development and testing of the OPLS all-atom force field on conformational energetics and properties of organic liquids. *J Am Chem Soc* 118, 11225-11236, (1996).
Additional Information:
Supplementary information is available in the online version of the paper. Reprints and permissions information is available online at www.nature.com/reprints.

METHODS REFERENCES

53. Plimpton, S. Fast parallel algorithms for short-range molecular dynamics. *J Comput Phys* 117, 1-19, (1995).
Supplementary Information (for Specific Example 2):

Wetting Opacity of Electrically Conductive and Mechanically Flexible 3D Nanostructured Graphene S1. Water Contact Angle Measurements The water contact angle was measured from the tangent angle formed at the three-phase contact of droplets captured by an in-house telescope-goniometer set up. For each sample, the measurements were made at three randomly chosen locations on the sample surface, and two independent drop shape analysis methods were used for each measurement: a general method to measure the contact angle by using Dropsnak plugin of imageJ software with a piece-wise polynomial fit (Axisymmetric Drop Shape Analysis (ADSA) method) and a θ/2 method (where the liquid drop is assumed to be part of a sphere, by measuring the drop diameter and the height of the apex, the contact angle was calculated based on the equation below).

$$\frac{\theta}{2} = \tan^{-1}\left(\frac{h}{d}\right)$$

The average and standard deviation of measured contact angles was calculated. The reported contact angle is the average of the measured contact angle. For each droplet, a 3 μL volume of water was used to avoid gravity-induced droplet-size alteration and the measurements were performed at ambient condition.

S2. Environmental Scanning Electron Microscopy

The in-situ microscale wettability evolution on the unannealed and pulse-laser laser annealed printed graphene (laser energy density 100 mJ cm$^{-2}$) surfaces were performed by using an environmental scanning electron microscope (ESEM). A variable pressure (chamber pressure was varied between 400 Pa and 655 Pa), relative chamber humidity (between 61% and 100%) and variable temperature of the SEM sample stage (between 0.1° C. to 2.0° C.) with a FEI Quanta 250 FE-SEM were used for the environmental wetting test. While the printed graphene without the pulse laser treatment did indeed show small contact angle (with a spreading and wetting of the surface) at microscale, the printed graphene with pulse laser treatment showed clear spherical droplet formation from microscale. Movies corresponding to these two situations are shown in supplementary video 1 and 2 respectively.

REFERENCES

1. Rafiee, J.; Mi, X.; Gullapalli, H.; Thomas, A. V.; Yavari, F.; Shi, Y.; Ajayan, P. M.; Koratkar, N. A., Wetting Transparency of Graphene. *Nat Mater* 2012, 11, 217-222.
2. Scocchi, G.; Sergi, D.; D'Angelo, C.; Ortona, A., Wetting and Contact-Line Effects for Spherical and Cylindrical Droplets on Graphene Layers: A Comparative Molecular-Dynamics Investigation. *Physical Review E* 2011, 84, 061602.
3. Berendsen, H. J. C.; Grigera, J. R.; Straatsma, T. P., The Missing Term in Effective Pair Potentials. *The Journal of Physical Chemistry* 1987, 91, 6269-6271.

4. Hockney, R. W.; Eastwood, J. W., *Computer Simulation Using Particles*; Taylor \& Francis, Inc., 1988, p 564.
5. Yeh, I.-C.; Berkowitz, M. L., Ewald Summation for Systems with Slab Geometry. *The Journal of Chemical Physics* 1999, 111, 3155-3162.
6. Werder, T.; Walther, J. H.; Jaffe, R. L.; Halicioglu, T.; Koumoutsakos, P., On the Water-Carbon Interaction for Use in Molecular Dynamics Simulations of Graphite and Carbon Nanotubes. *The Journal of Physical Chemistry 8* 2003, 107, 1345-1352.
7. Jorgensen, W. L.; Maxwell, D. S.; Tirado-Rives, J., Development and Testing of the Opls All-Atom Force Field on Conformational Energetics and Properties of Organic Liquids. *Journal of the American Chemical Society* 1996, 118, 11225-11236.
8. Ma, M.; Tocci, G.; Michaelides, A.; Aeppli, G., Fast Diffusion of Water Nanodroplets on Graphene. *Nat Mater* 2016, 15, 66-71.
9. Ingebrigtsen, T.; Toxvaerd, S., Contact Angles of Lennard-Jones Liquids and Droplets on Planar Surfaces. *The Journal of Physical Chemistry C* 2007, 111, 8518-8523.
10. Li, Z., et. al. Effect of airborne contaminants on the wettability of supported graphene and graphite. Nature Mater. 2013, 12, 925-931.

F. Options and Alternatives

As will be appreciated by those skilled in this art, the invention can take many forms and embodiments. Variations obvious to those skilled in the art will be included within the invention.

Several examples of alternative and options have been given above. A few additional examples follow.

Ink formulation. The specific examples of ink formulation and process for producing it are not necessarily limiting of all forms and embodiments. For example, possible variations include:
 a. Graphene flake average size—from 1 μm to 10 μm.
 b. Processing step differences—probe sonication for 10-1 minutes, vertex mixing for ~5 minutes, filtration of ink using 0.45 μm filter syringe prior to loading the ink into the cartridge.

Inkjet printing. The specific devices can vary according to need or desire. Other commercially available inkjet printers are possible, including scale, processing capabilities and resolution. Discussion about some of these parameters and factors are in specific Example 1 supra. Both smaller table- or bench-top printers, and more commercial-scale inkjet printers and techniques are possible. Further details of such possibilities can be seen at the incorporated-by-reference citations supra.

As indicated above, other deposition or generation techniques can be used to create the graphene. A few non-limited examples are coating (e.g. spin, dip, spray). As will be appreciated by those skilled in the art, the graphene can be graphene as well as reduced graphene oxide.

Laser Annealing. The specific components and control regimes can vary according to need and desire. Other commercially available lasers, laser drivers/controllers, and ancillary equipment are possible. For example, possible variations include:
 a. Laser type—Krypton fluoride pulsed laser (wavelength 248 nm); Nd:Yag pulsed laser (355 nm).
 b. Wavelength—UV (e.g., 248 nm, 355 nm).
 c. Spot diameter—varies from $\mu m^2$ to $mm^2$.
 d. Maximum power density—10 $MW \cdot cm^{-2}$.
 e. Maximum energy—125 $mJ \cdot cm^{-2}$.
 f. Repetition rate—5 Hz to 10 Hz.
 g. Pulse width-15 to 20 ns.

The reasons these might be varied are: could change absorption of energy, could change the annealing of species differently, could cause fusion of species differently.

Applications/functionality. Various applications and functionalities for end products or articles of manufacture for the invention have been given above. Examples include:
 a. Circuits or circuit components—electrodes, capacitors, interconnects, or field effect transistors (FETs).
 b. Sensors—electrochemically sense hydrogen peroxide, electrolytes, redox probes (e.g., ferricyanide), salicylic acid (e.g., plant hormones). Sensing with the aid of an enzyme such as metabolites (e.g., glucose, lactate), neurotransmitters (e.g., glutamate), and nerve agents (e.g., organophosphates). Sensing with the aid of an ion selective membrane (ammonium, potassium, nitrate, orthophosphates). Sensing with the aid of an antibody, aptamer, or peptide for monitoring proteins, DNA/RNA, and other small molecules for a variety of applications including but not limited to cancer diagnostics, diabetes management, stress management, bioterror agent detection, drug testing/screening, soil nutrient and pesticide managements, and water quality testing.
 c. Articles of manufacture—thin film transistors, acoustic actuator, dipole antennas, supercapacitor, temperature sensors, and transparent conductors on non-flexible or flexible substrates.
 d. Transparent heaters, solar cells, and photo detectors.

What is claimed is:

1. A method of processing graphene on a substrate comprising:
 a. providing a graphene ink comprising, in solution, graphene flakes;
 b. applying the graphene ink to the substrate in a predetermined pattern; and
 c. post-application processing one or more selected portions of the applied predetermined pattern of the graphene ink by:
  i. controlling laser power density of a laser at the one or more selected portions of the applied predetermined pattern of the graphene ink by pulsing the laser at a wavelength, pulse width, repetition rate, and laser energy effective to:
   (1) physically join at least some of the graphene flakes to form a generally planar 2D structure,
   (2) transform the generally planar two-dimensional (2D) structure to a generally three-dimensional (3D) structure; and
   (3) wherein the laser energy is controlled to be non-destructive of the applied predetermined pattern or the substrate;
 d. so that the post-application processing tunes an electrical or physical property of the one or more selected portions of the applied predetermined pattern of the graphene ink.

2. The method of claim 1 wherein the controlling of the laser power density of the laser at the one or more selected portions of the applied predetermined pattern of the graphene ink further comprises:
 a. shaping the laser to a beam shape with a beam shaper;
 b. focusing the laser to a beam area with a lens;
 c. adjusting at least one of:
  i. the laser wavelength;
  ii. the beam area;
  iii. the laser power density;

iv. the laser repetition rate;
v. the laser pulse width.

3. The method of claim 2 wherein the laser is a Nd:YAG laser and where the applied predetermined pattern of the graphene ink has a thickness of approximately 3.5 μm, and the adjusting of the laser comprises:
   i. the laser wavelength is 355 nm;
   ii. the beam area is 0.28 $cm^{-2}$;
   iii. the laser energy is between 55 $mJ/cm^{-2}$ and 85 $mJ/cm^{-2}$;
   iv. the laser repetition rate is 5 Hz; and
   v. the laser pulse width is 15 ns.

4. The method of claim 2 wherein the laser is a third harmonic Nd:YAG UV laser or a krypton fluoride pulsed laser.

5. The method of claim 4 wherein the controlling further comprises:
   i. the laser wavelength is 248 nm for the krypton fluoride pulsed laser, or 355 nm for the Nd:YAG UV laser;
   ii. the beam area is 0.28 $cm^2$;
   iii. the laser power density has a maximum density of 10 $MW/cm^2$;
   iv. the laser energy is between 40 mJ $cm^{-2}$ and 125 mJ $cm^{-2}$;
   v. the laser repetition rate is 5-10 Hz; and
   vi. the laser pulse width is 15-20 ns.

6. The method of claim 1 further comprising:
   a. the controlling of the laser comprises spatially controlling the laser along the one or more portions of the applied predetermined pattern of the graphene ink.

7. The method of claim 6 wherein the controlling of the laser to the applied predetermined pattern of the graphene ink comprises:
   a. focusing the laser to a spot size within the applied predetermined pattern of the graphene ink wherein the spot size is tunable with a lens; and
   b. translating the focused laser across the selected one or more portions of the applied predetermined pattern of the graphene ink.

8. The method of claim 1 wherein the substrate comprises a non-flexible material.

9. The method of claim 1 wherein the substrate comprises a flexible material.

10. The method of claim 9 wherein the flexible material comprises:
    a. cellulose-based paper; or
    b. polyimide.

11. The method of claim 1 wherein the applied predetermined pattern of the graphene ink comprises the graphene flakes and one or more non-conductive ink binder or binders, the graphene flakes including conductive components having graphene flake-to-flake boundaries, and further comprising adjusting the laser power density to a level effective for at least one of:
    a. annealing the applied predetermined pattern of the graphene ink to increase conductivity of the conductive components of the graphene flakes, and
    b. removing at least some of the one or more non-conductive ink binder or binders.

12. The method of claim 1 wherein the generally 3D structure comprises 3D graphene petals.

13. The method of claim 1 further comprising using the post-application processed applied predetermined pattern for electrochemical or biosensing.

14. The method of claim 13 wherein the electrochemical or the biosensing comprises:
    a. ferricyanide redox peak separation;
    b. hydrogen peroxide sensing;
    c. ion-selectable sensing;
    d. potassium, ammonium, enzymatic xanthene, or glucose oxidase sensing; or
    e. sensing proteins, DNA, or RNA with an antibody, aptamer or peptide on the generally three-dimensional structure.

15. The method of claim 1 further comprising tuning the laser power density to a level effective for:
    a. tuning hydrophobicity or hydrophilicity of the applied predetermined pattern.

16. The method of claim 15 wherein the tuning of hydrophobicity or hydrophilicity comprises:
    a. increasing from hydrophilic to above hydrophilic; or
    b. increasing from hydrophobic to super hydrophobic.

17. The method of claim 1 wherein the applying comprises inkjet printing the graphene ink.

18. The method of claim 1 wherein the applying comprises one of:
    a. ink jet printing;
    b. screen printing;
    c. gravure printing;
    d. dip coating application;
    e. spray coating application; and
    f. spin coating application.

19. The method of claim 1 wherein the applied predetermined pattern of the graphene ink comprises an electrical circuit.

* * * * *